United States Patent
Volfovski et al.

(10) Patent No.: US 11,842,917 B2
(45) Date of Patent: Dec. 12, 2023

(54) PROCESS KIT RING ADAPTOR

(71) Applicant: Applied Materials, Inc., Santa Clara, CA (US)

(72) Inventors: Leon Volfovski, Mountain View, CA (US); Andreas Schmid, Meyriez (CH); Denis Martin Koosau, Pleasanton, CA (US); Nicholas Michael Kopec, Santa Clara, CA (US); Steven Babayan, Los Altos, CA (US); Douglas R. McAllister, San Ramon, CA (US); Helder Lee, San Jose, CA (US); Jeffrey Hudgens, San Francisco, CA (US); Damon K. Cox, Jarrell, TX (US)

(73) Assignee: Applied Materials, Inc., Santa Clara, CA (US)

( * ) Notice: Subject to any disclaimer, the term of this patent is extended or adjusted under 35 U.S.C. 154(b) by 45 days.

(21) Appl. No.: 17/216,439

(22) Filed: Mar. 29, 2021

(65) Prior Publication Data
US 2021/0217650 A1 Jul. 15, 2021

Related U.S. Application Data

(63) Continuation of application No. 16/417,369, filed on May 20, 2019, now Pat. No. 10,964,584.

(51) Int. Cl.
*H01L 21/68* (2006.01)
*H01L 21/687* (2006.01)
(Continued)

(52) U.S. Cl.
CPC ........ *H01L 21/68735* (2013.01); *H01L 21/68* (2013.01); *H01L 21/6838* (2013.01);
(Continued)

(58) Field of Classification Search
CPC ........ H01L 21/68735; H01L 21/68707; H01L 21/68742; H01L 21/67706; C23C 16/4584; C23C 16/4585; H01J 37/32642
See application file for complete search history.

(56) References Cited

U.S. PATENT DOCUMENTS

| | | |
|---|---|---|
| 5,749,469 A | 5/1998 | Williams |
| D407,073 S | 3/1999 | Burkhart |

(Continued)

FOREIGN PATENT DOCUMENTS

| | | |
|---|---|---|
| CN | 101216686 A | 7/2008 |
| CN | 106611727 A | 5/2017 |

(Continued)

OTHER PUBLICATIONS

International Seach Report and Written Opinion dated Jul. 9, 2021, for International Application No. PCT/US2021/023494.

(Continued)

*Primary Examiner* — Ronald P Jarrett
(74) *Attorney, Agent, or Firm* — Lowenstein Sandler LLP

(57) ABSTRACT

A process kit ring adaptor includes one or more upper surfaces and one or more lower surfaces. The one or more upper surfaces are configured to support a process kit ring. The one or more lower surfaces are configured to interface with an end effector. The process kit ring adaptor supporting the process kit ring is configured to be transported on the end effector within a processing system.

20 Claims, 10 Drawing Sheets

(51) Int. Cl.
*H01L 21/683* (2006.01)
*H01L 21/677* (2006.01)
(52) U.S. Cl.
CPC .. *H01L 21/68707* (2013.01); *H01L 21/68721* (2013.01); *H01L 21/68742* (2013.01); *H01L 21/677* (2013.01)

(56) References Cited

U.S. PATENT DOCUMENTS

| | | | |
|---|---|---|---|
| 6,199,291 | B1 | 3/2001 | Ozee |
| 6,676,759 | B1 | 1/2004 | Takagi |
| D489,739 | S | 5/2004 | Okugawa |
| D616,389 | S | 5/2010 | Takahashi |
| 7,792,350 | B2 | 9/2010 | Kiley et al. |
| 8,384,033 | B2 | 2/2013 | Burns et al. |
| 8,397,739 | B2 | 3/2013 | Gregor et al. |
| D684,546 | S | 6/2013 | Kuzuoka |
| 8,784,033 | B2 | 7/2014 | Kremerman et al. |
| 9,457,464 | B2 | 10/2016 | Kremerman et al. |
| 9,462,732 | B2 | 10/2016 | Robinson |
| 9,547,769 | B2 | 1/2017 | Aissi |
| 9,579,788 | B2 | 2/2017 | Rosenberg et al. |
| 9,799,542 | B2 * | 10/2017 | Sugawara ......... H01L 21/68742 |
| 9,881,820 | B2 | 1/2018 | Wong et al. |
| 9,947,517 | B1 | 4/2018 | Luere et al. |
| 10,014,198 | B2 | 7/2018 | Richardson |
| 10,041,868 | B2 | 8/2018 | Gottscho |
| 10,062,589 | B2 | 8/2018 | Wong et al. |
| 10,062,590 | B2 | 8/2018 | Wong et al. |
| 10,062,599 | B2 | 8/2018 | Genetti et al. |
| 10,103,010 | B2 | 10/2018 | Luere et al. |
| 10,124,492 | B2 | 11/2018 | Genetti et al. |
| D908,645 | S | 1/2021 | Savandaiah |
| 11,075,101 | B2 | 7/2021 | Kuwahara et al. |
| D947,802 | S | 4/2022 | Sakata |
| 2003/0010657 | A1 | 1/2003 | Zabka |
| 2005/0122504 | A1* | 6/2005 | Rice .................. H01L 21/67775 355/72 |
| 2007/0134904 | A1 | 6/2007 | Wan et al. |
| 2010/0194015 | A1 | 8/2010 | Vekstein et al. |
| 2015/0041353 | A1 | 2/2015 | Adams |
| 2016/0211165 | A1 | 7/2016 | McChesney et al. |
| 2016/0211166 | A1 | 7/2016 | Yan et al. |
| 2016/0216185 | A1 | 7/2016 | Gottscho |
| 2017/0053819 | A1 | 2/2017 | Richardson |
| 2017/0113355 | A1 | 4/2017 | Genetti et al. |
| 2017/0115657 | A1 | 4/2017 | Trussell et al. |
| 2017/0117172 | A1 | 4/2017 | Genetti et al. |
| 2017/0119339 | A1 | 5/2017 | Johnson et al. |
| 2017/0133283 | A1 | 5/2017 | Kenworthy |
| 2017/0213758 | A1 | 7/2017 | Rice et al. |
| 2017/0236688 | A1 | 8/2017 | Caron et al. |
| 2017/0236741 | A1 | 8/2017 | Angelov et al. |
| 2017/0236743 | A1 | 8/2017 | Severson et al. |
| 2017/0263478 | A1 | 9/2017 | McChesney et al. |
| 2017/0287682 | A1 | 10/2017 | Musselman et al. |
| 2017/0287753 | A1 | 10/2017 | Musselman et al. |
| 2017/0330786 | A1 | 11/2017 | Genetti et al. |
| 2017/0334074 | A1 | 11/2017 | Genetti et al. |
| 2018/0019107 | A1 | 1/2018 | Ishizawa |
| 2018/0019142 | A1 | 1/2018 | Wong et al. |
| 2018/0032062 | A1 | 2/2018 | Trussell et al. |
| 2018/0040492 | A1 | 2/2018 | Wong et al. |
| 2018/0068879 | A1 | 3/2018 | Wong et al. |
| 2018/0090354 | A1 | 3/2018 | Sugita et al. |
| 2018/0166259 | A1 | 6/2018 | Ueda |
| 2018/0218933 | A1 | 8/2018 | Luere et al. |
| 2018/0233328 | A1 | 8/2018 | Ueda et al. |
| 2018/0277416 | A1 | 9/2018 | Takahashi et al. |
| 2018/0301322 | A1 | 10/2018 | Sugita et al. |
| 2018/0315583 | A1 | 11/2018 | Luere et al. |
| 2018/0315640 | A1 | 11/2018 | Ueda et al. |
| 2019/0088531 | A1 | 3/2019 | Sarode Vishwanath et al. |
| 2020/0122320 | A1 | 4/2020 | Yoshida et al. |
| 2020/0211877 | A1 | 7/2020 | Raschke |
| 2020/0373194 | A1 | 11/2020 | Volfovski et al. |
| 2021/0296149 | A1 | 9/2021 | Green |

FOREIGN PATENT DOCUMENTS

| | | |
|---|---|---|
| CN | 107481967 A | 12/2017 |
| JP | 10165884 A | 6/1998 |
| JP | 2007027591 A | 2/2007 |
| JP | 2009095783 A | 5/2009 |
| JP | 4559317 B2 | 10/2010 |
| KR | 20160016409 A | 2/2016 |
| WO | 2004059724 A1 | 7/2004 |

OTHER PUBLICATIONS

International Seach Report and Written Opinion dated Sep. 1, 2020, for application No. PCT/US2020/033774.
Entegris F300 AutoPds, Wafer Carrier Clean, Secure wafer transport and optimum automation intergartion, https://www.entergris.com.
Entegris Spectra Foup, Front opening unified pod platform with superior microenvironment control, https:/www.entegris.com/content/dam/shared-product-assets/wafer-processing/datasheet-spectra-foup-2413.pdf, Retrieved May 20, 2019.

* cited by examiner

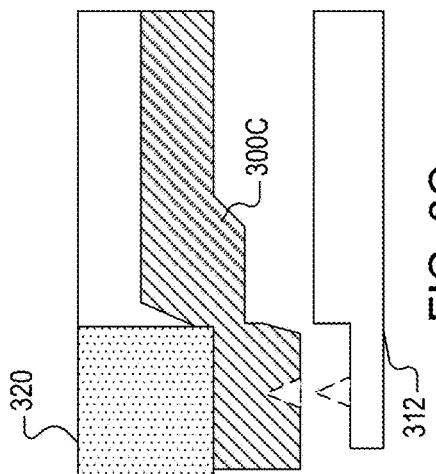
FIG. 3A
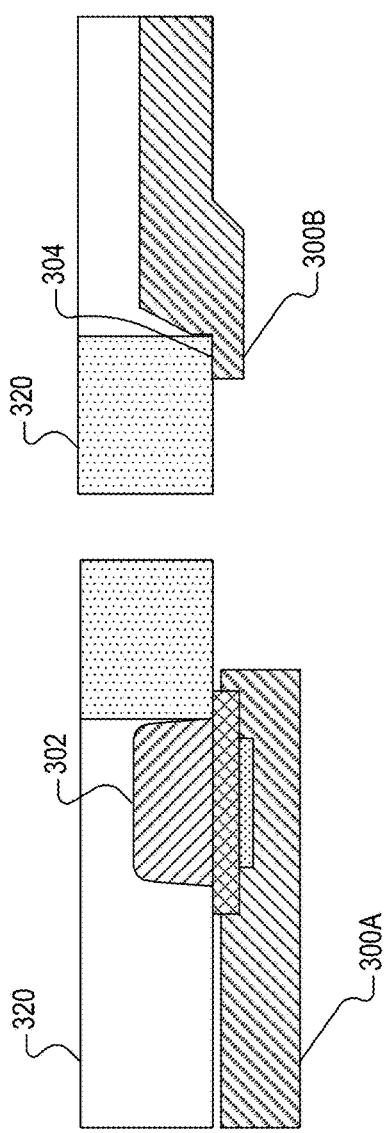
FIG. 3B
FIG. 3C
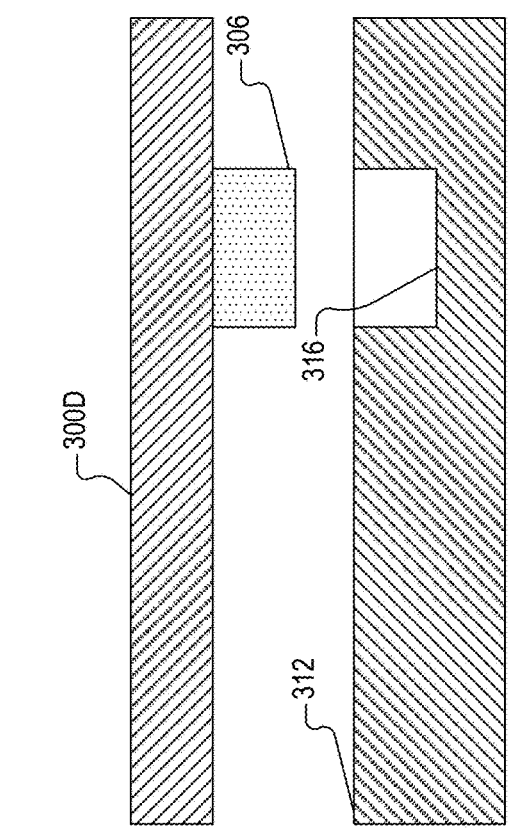
FIG. 3D
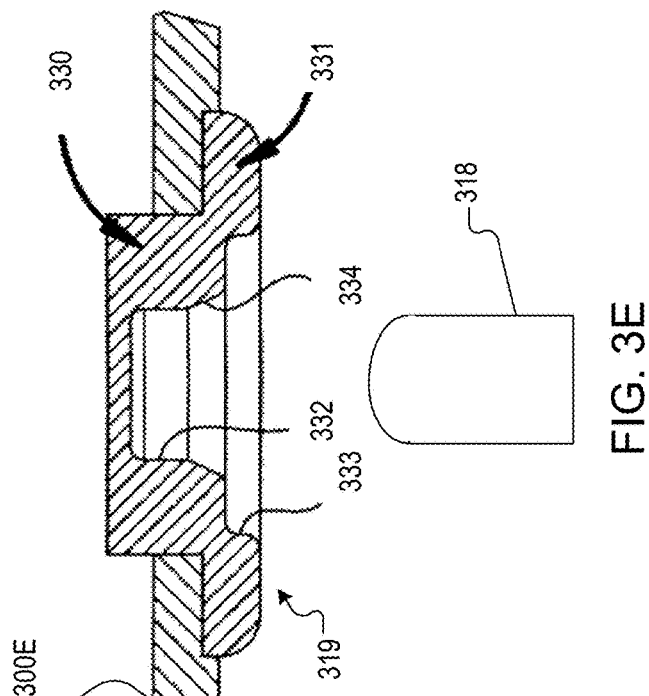
FIG. 3E

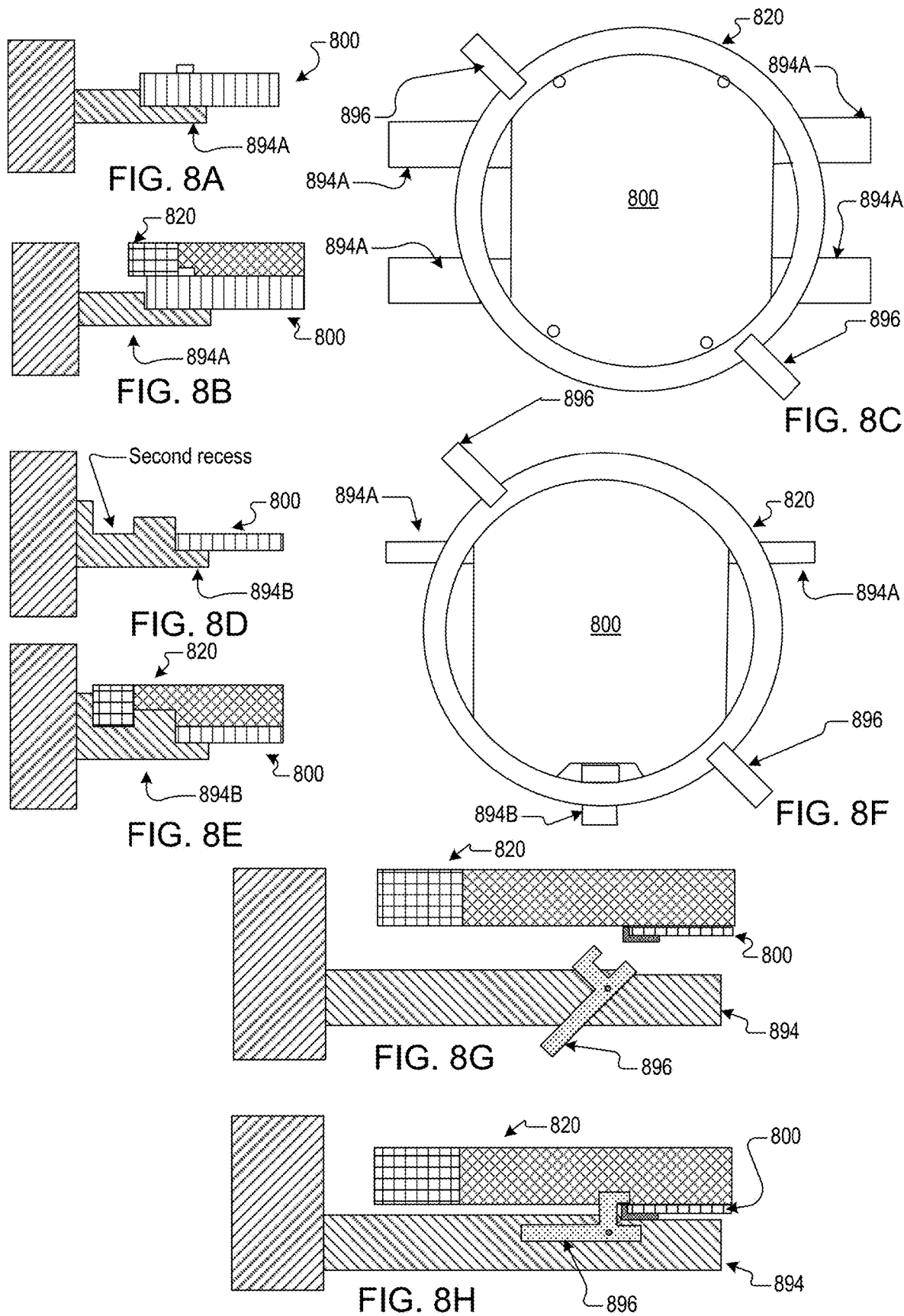

PROCESS KIT RING ADAPTOR

RELATED APPLICATION

This application is a continuation application of U.S. patent application Ser. No. 16/417,369, filed May 20, 2019, the entire contents of which are hereby incorporated by reference herein.

TECHNICAL FIELD

Embodiments of the present disclosure relate to apparatuses and methods for process kit ring replacement in processing chambers, such as those used in wafer processing systems, and in particular to a process kit ring adaptor for securing a process kit ring.

BACKGROUND

In semiconductor processing and other electronics processing, platforms are often used that use robotic arms to transport objects such as wafers between processing chambers, from storage areas (e.g., front opening unified pods (FOUPs)) to processing chambers, from processing chambers to storage areas, and so on. A processing system, such as a wafer processing system, has one or more processing chambers for processing of substrates. A gas may be used to etch a substrate in a processing chamber (e.g., a substrate may be etched while electrostatically clamped in position in an etch chamber). One or more process kit rings may surround a substrate (e.g., to protect one or more portions of the processing chamber, the substrate, etc.). For example, a circular part, referred to as an edge ring or process kit ring, is positioned immediately outside of the outer diameter of the substrate to protect the upper surface of a chuck (e.g., an electrostatic chuck) supporting the substrate from being etched by etchant chemistry. Process kit rings are made from several different materials and can have different shapes, both which affect process uniformity near the process kit ring. During processing, process kit rings are etched over time and result in shape changes as well as changes in processing uniformity.

To address the changes in processing uniformity due to process kit ring deterioration, process kit rings are replaced according to a schedule. Conventionally, to replace a process kit ring, an operator opens a processing chamber to have access to the process kit ring inside, manually removes and replaces the process kit ring, and closes the processing chamber. While the processing chamber is open, the processing chamber and the processing system may become contaminated with cells, hair, dust, etc. The processing chamber and/or processing system then goes through a requalification process that may remove the processing chamber and/or processing system from operation for days to weeks. This impacts the line yield, scheduling, quality (e.g., responsive to adding variables to the system), and so forth.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a process kit ring adaptor includes a rigid carrier. The rigid carrier may include an upper surface including a first distal portion and a second distal portion to support a process kit ring. The rigid carrier may further include a lower surface including a first region to interface with an end effector configured to support wafers and a solid planar central region to interface with a vacuum chuck.

In another aspect of the disclosure, a process kit ring adaptor includes a first reinforcement structure including a first distal end and a second distal end for supporting a process kit ring. The process kit ring adaptor further includes a vacuum interface structure, coupled to a lower surface of the first reinforcement structure, forming a solid planar lower surface to interface with a vacuum chuck.

In another aspect of the disclosure, a method includes lifting, using an end effector on a robot arm of a processing system, a process kit ring adaptor and process kit ring disposed on a first distal end and a second distal end of the process kit ring adaptor. A first upper surface of the end effector interfaces with a lower surface of the process kit ring adaptor. The method further includes placing, using the end effector, the process kit ring adaptor on a vacuum chuck. A planar central region of the lower surface of the process kit ring adaptor interfaces with the vacuum chuck. The method further includes rotating, using the vacuum chuck, the process kit ring adaptor and the process kit ring to align the process kit ring. The method further includes lifting, using the end effector, the process kit ring adaptor and process kit ring from the vacuum chuck for process kit ring replacement in a process chamber of the processing system.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 3A illustrates a cross-sectional view of a pin contact on a process kit ring adaptor, according to certain embodiments.

FIG. 3B illustrates a cross-sectional view of a process kit ring adaptor that forms a recess, according to certain embodiments.

FIG. 3C illustrates a cross-sectional view of a process kit ring adaptor that interfaces with an end effector, according to certain embodiments.

FIG. 3D illustrates a cross-sectional view of a process kit ring adaptor that interfaces with an end effector, according to certain embodiments.

FIG. 3E illustrates a cross-sectional view of a process kit ring adaptor that interfaces with a lift pin, according to certain embodiments.

FIG. 8A illustrates a cross-sectional view of a process kit ring adaptor on a fin of a support structure of a process kit enclosure system, according to certain embodiments.

FIG. 8B illustrates a cross-sectional view of a process kit ring disposed on a process kit ring adaptor on a fin of a support structure of a process kit enclosure system, according to certain embodiments.

FIG. 8C illustrates a top view of retention devices securing a process kit ring disposed on a process kit ring adaptor on a fin of a support structure of a process kit enclosure system, according to certain embodiments.

FIG. 8D illustrates a cross sectional view of a process kit ring adaptor on a fin of a support structure of a process kit enclosure system, according to certain embodiments.

FIG. 8E illustrates a cross sectional view of a process kit ring disposed on a process kit ring adaptor on a fin of a support structure of a process kit enclosure system, according to certain embodiments.

FIG. 8F illustrates a top view of retention devices securing a process kit ring disposed on a process kit ring adaptor on fins of support structures of a process kit enclosure system, according to certain embodiments.

FIGS. 8G-H illustrate cross sectional views of a process kit ring adaptor and a fin of a process kit enclosure system, according to certain embodiments.

DETAILED DESCRIPTION OF EMBODIMENTS

Figure 1:
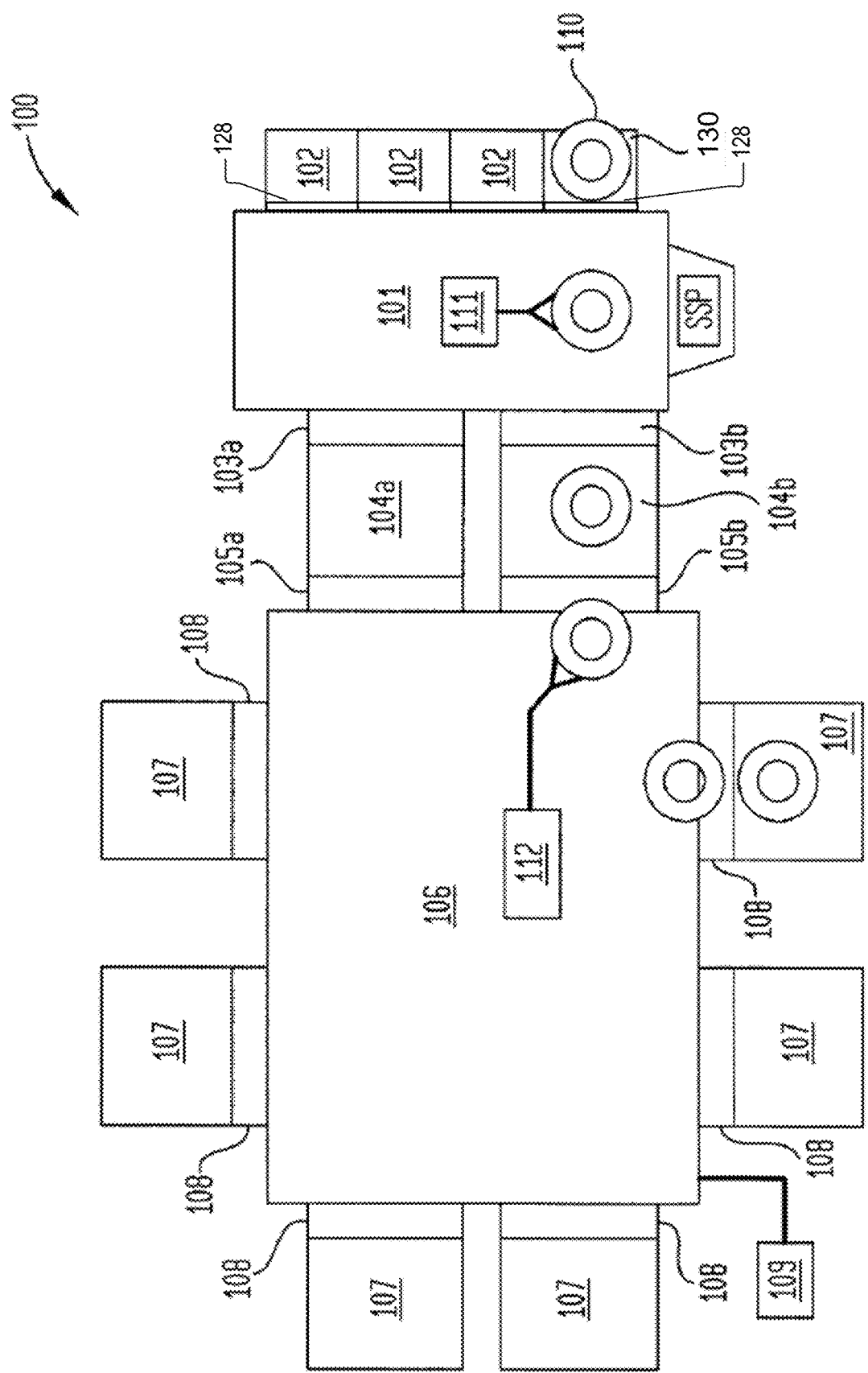
FIG. 1 illustrates a processing system, according to one aspect of the disclosure.

Embodiments described herein are related to a process kit ring adaptor. Process kit rings may surround substrates and/or portions of substrate support assemblies in a processing chamber to protect components (e.g., to protect the substrate support assembly) of the processing chamber. As the substrates are etched by etchant chemistry, the process kit rings may deteriorate over time. Deteriorated processing kit rings lead to processing non-uniformity (e.g., non-uniformity in processed substrates, non-uniformity in processes, etc.). To avoid non-uniformity, process kit rings are to be periodically replaced. Conventionally, to replace a process kit ring, the processing chamber is opened. After being opened, the processing chamber goes through a long requalification process. The requalification process impacts line yield, scheduling, quality, user time, energy used, and so forth.

The devices, systems, and methods disclosed herein use a process kit ring adaptor to enable automated replacement of process kit rings (e.g., without opening a process chamber). One or more lower surfaces of the process kit ring adaptor may interface with an end effector on a robot arm and one or more lower surfaces of the process kit ring adaptor may interface with a vacuum chuck. One or more upper surfaces of the process kit ring adaptor may support a process kit ring (or multiple different process kit rings). In some embodiments, a process kit ring adaptor may include a rigid carrier including an upper surface and a lower surface. The upper surface may include a first distal portion and a second distal portion to support a process kit ring. The lower surface may include a first region to interface with an end effector configured to support wafers and a solid planar central region to interface with a vacuum chuck. In some embodiments, the process kit ring adaptor may include a first reinforcement structure and a vacuum interface structure coupled to a lower surface of the first reinforcement structure. The first reinforcement structure may include a first distal end and a second distal end for supporting a process kit ring. The vacuum interface structure may from a solid planar lower surface to interface with a vacuum chuck. In some embodiments, the solid planar central region is omitted and the process kit ring adaptor is not chucked using a vacuum chuck.

The devices, systems, and methods disclosed herein have advantages over conventional solutions. The process kit ring adaptor may enable automated replacement of process kit rings in a wafer processing system without opening of a process chamber and without a subsequent requalification process. The process kit ring adaptor may interface with equipment used for transfer of wafers (e.g., end effector on a robot arm, vacuum chuck, lift pins, etc.). Use of the process kit ring adaptor enables wafer handling components (e.g., vacuum chucks, end effectors, robot arms, slit valves, load ports, etc.) of a wafer processing system to also handle process kit rings without adaptation or with minimal adaptation. Use of the process kit ring adaptor to replace process kit rings has less impact on line yield, scheduling, substrate quality, user time, energy used, and so forth than conventional solutions.

FIG. 1 illustrates a processing system 100 (e.g., a wafer processing system), according to one aspect of the disclosure. The processing system 100 includes a factory interface 101 that includes multiple load ports 128 to which cassettes 102 (e.g., FOUPs) may be coupled for transferring wafers and/or other substrates into and out of the processing system 100. The factory interface 101 may also include a process kit enclosure system 130 (e.g., cassette, FOUP, etc.) coupled to a load port 128 for transferring content 110, such as process kit rings into and out of the processing system 100.

A load port 128 may include a front interface that forms a vertical opening. The load port 128 may also have a horizontal surface. A cassette 102 (e.g., FOUP) may have a front interface that forms a vertical opening. The front interface of the cassette 102 may be sized to interface with the front interface of the load port 128 (e.g., the vertical opening of the cassette 102 may be approximately the same size as the vertical opening of the load port 128). The cassette 102 may be placed on the horizontal surface of the load port 128 and the vertical opening of the FOUP may align with the vertical opening of the load port 128. The front interface of the cassette 102 may interconnect with (e.g., clamp to, be secured to, be sealed to) the front interface of the load port 128. A bottom plate (e.g., base plate) of the cassette 102 may have features (e.g., load features, such as recesses, that engage with load port kinematic pin features, a load port datum pin clearance, and/or a cassette 102 docking tray latch clamping feature) that engage with the horizontal surface of the load port 128. The process kit enclosure system 130 may have features similar to those of cassette 102 to interface with the load port 128 in a similar manner. The process kit enclosure system 130 may have a front interface that is also sized to interface with the front interface of the load port. The process kit enclosure system 130 may be placed on the horizontal surface of the load port 128 and the vertical opening of the process kit enclosure system 130 may align with the vertical opening of the load port 128. The front interface of the process kit enclosure system 130 may interconnect with the front interface of the load port 128. The process kit enclosure system 130 may also have a base plate that has features to engage with the horizontal surface of the load port. The process kit enclosure system 130 may interface with the same load ports that are used for FOUPs and cassettes that contain wafers.

The process kit enclosure system 130 may include one or more items of content 110, such as a process kit ring adaptor, a process kit ring disposed on a process kit ring adaptor, etc. For example, the process kit enclosure system 130 may be coupled to the factory interface 101 (e.g., load port 128) to enable automated transfer of a process kit ring on a process kit ring carrier into the processing system 100 for replacement of a used process kit ring.

The processing system 100 also includes first vacuum ports 103a, 103b coupling the factory interface 101 to respective degassing chambers 104a, 104b. Second vacuum ports 105a, 105b may be coupled to respective degassing chambers 104a, 104b and disposed between the degassing chambers 104a, 104b and a transfer chamber 106 to facilitate transfer of wafers and content 110 (e.g., process kit rings) into the transfer chamber 106. In some embodiments, a processing system 100 includes and/or uses one or more degassing chambers 104 and a corresponding number of vacuum ports 103, 105 (e.g., a processing system 100 may include a single degassing chamber 104, a single first vacuum port 103, and a single second vacuum port 105). The transfer chamber 106 includes a plurality of processing chambers 107 (e.g., four processing chambers 107, size processing chambers, etc.) disposed therearound and coupled thereto. The processing chambers 107 are coupled to the transfer chamber 106 through respective ports 108, such as slit valves or the like. In some embodiments, the factory interface 101 is at a higher pressure (e.g., atmospheric pressure) and the transfer chamber 106 is at a lower pressure. Each degassing chamber 104 (e.g., load lock, pressure chamber) may have a first door (e.g., first vacuum port 103) to seal the degassing chamber 104 from the factory interface 101 and a second door (e.g., second vacuum port 105) to seal the degassing chamber 104 from the transfer chamber 106. Content may be transferred from the factory interface 101 into a degassing chamber 104 while the first door is open and the second door is closed, the first door may close, the pressure in the degassing chamber 104 may reduce to match the transfer chamber 106, the second door may open, and the content may be transferred out of the degassing chamber 104. A local center finding (LCF) device may be used to align the content in the transfer chamber 106 (e.g., before entering a processing chamber 107, after leaving the processing chamber 107). For example, a LCF device may determine a position of content (e.g., a process kit ring adaptor and/or process kit ring) with respect to the end effector of the robot arm (e.g., determine location with respect to an alignment point or centerline of the end effector). The LCF device may perform laser center finding LCF beam trajectories to perform LCF edge capture for x-y alignment of the process kit ring adaptor and/or the process kit ring. In some embodiments, the LCF device is an aligner device.

The processing chambers 107 may include one or more of etch chambers, deposition chambers (including atomic layer deposition, chemical vapor deposition, physical vapor deposition, or plasma enhanced versions thereof), anneal chambers, and the like. Some of the processing chambers 107, such as etch chambers, may include process kit rings (e.g., edge ring, processing ring, support ring, sliding ring, quartz ring, etc.) therein, which occasionally are to be replaced. While conventional systems are associated with disassembly of a processing chamber by an operator to replace a process kit ring, the processing system 100 is configured to facilitate replacement of process kit rings without disassembly of a processing chamber 107 by an operator.

Factory interface 101 includes a factory interface robot 111. Factory interface robot 111 may include a robot arm (e.g., including an end effector), and may be or include a selective compliance assembly robot arm (SCARA) robot, such as a 2 link SCARA robot, a 3 link SCARA robot, a 4 link SCARA robot, and so on. The factory interface robot 111 may include an end effector on an end of the robot arm. The end effector may be configured to pick up and handle specific objects, such as wafers. Alternatively, the end effector may be configured to handle objects such as a process kit ring (edge rings) disposed on a process kit ring adaptor. The factory interface robot 111 may be configured to transfer objects between cassettes 102 (e.g., FOUPs) and degassing chambers 104a, 104b.

Transfer chamber 106 includes a transfer chamber robot 112. Transfer chamber robot 112 may include a robot arm with an end effector at an end of the robot arm. The end effector may be configured to handle particular objects, such as wafers. The transfer chamber robot 112 may be a SCARA robot, but may have fewer links and/or fewer degrees of freedom than the factory interface robot 111 in some embodiments. The end effector of the transfer chamber robot 112 may additionally be configured to handle specific objects, such as wafers.

A controller 109 controls various aspects of the processing system 100. The controller 109 may be and/or include a computing device such as a personal computer, a server computer, a programmable logic controller (PLC), a microcontroller, and so on. The controller 109 may include one or more processing devices, which may be general-purpose processing devices such as a microprocessor, central processing unit, or the like. More particularly, the processing device may be a complex instruction set computing (CISC) microprocessor, reduced instruction set computing (RISC)

microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 109 may include a data storage device (e.g., one or more disk drives and/or solid state drives), a main memory, a static memory, a network interface, and/or other components. The controller 109 may execute instructions to perform any one or more of the methods or processes described herein. The instructions may be stored on a computer readable storage medium, which may include the main memory, static memory, secondary storage and/or processing device (during execution of the instructions). The controller 109 may receive signals from and send controls to factory interface robot 111 and wafer transfer chamber robot 112 in embodiments.

FIG. 1 schematically illustrates transfer of content 110 (e.g., a process kit ring coupled to a process kit ring adaptor) into a processing chamber 107. According to one aspect of the disclosure, content 110 is removed from a process kit enclosure system 130 via factory interface robot 111 located in the factory interface 101. The factory interface robot 111 transfers the content 110 through one of the first vacuum ports 103a, 103b and into a respective degassing chamber 104a, 104b. A transfer chamber robot 112 located in the transfer chamber 106 removes the content 110 from one of the degassing chambers 104a, 104b through a second vacuum port 105a or 105b. The transfer chamber robot 112 moves the content 110 into the transfer chamber 106, where the content 110 may be transferred to a processing chamber 107 though a respective port 108. While not shown for clarity in FIG. 1, transfer of the content 110 may include transfer of a process kit ring disposed on a process kit ring adaptor, transfer of an empty process kit ring adaptor, transfer of a placement validation wafer, etc.

FIG. 1 illustrates one example of transfer of content 110, however, other examples are also contemplated. For example, it is contemplated that the process kit enclosure system 130 may be coupled to the transfer chamber 106 (e.g., via a load port in the transfer chamber 106). From the transfer chamber 106, the content 110 may be loaded into a processing chamber 107 by the transfer chamber robot 112. Additionally, content 110 may be loaded in a substrate support pedestal (SSP). An additional SSP may be positioned in communication with the factory interface 101 opposite the illustrated SSP. It is contemplated that a processed content 110 (e.g., used process kit ring) may be removed from the processing system 100 in reverse of any manner described herein. When utilizing multiple process kit enclosure systems 130 or a combination of process kit enclosure system 130 and SSP, it is contemplated that one SSP or process kit enclosure system 130 may be used for unprocessed content 110 (e.g., new process kit rings), while another SSP or process kit enclosure system 130 may be used for receiving processed content 110 (e.g., used process kit rings).

In some embodiments, a process kit ring that is secured to an upper surface of a process kit ring adaptor may be stored in the process kit enclosure system 130 and a factory interface robot 111 may insert an end effector of the factory interface robot 111 into the process kit enclosure system 130 below the process kit ring adaptor, lift the process kit ring adaptor, and extract the process kit ring adaptor from the process kit enclosure system 130 to transport the process kit ring secured to the process kit ring adaptor on the robot within the processing system 100. In some embodiments, a process kit ring is stored within the process kit enclosure system 130 (e.g., without being secured to a process kit ring adaptor). Factory interface robot 111 may obtain an empty process kit ring adaptor from within the processing system 100 or the process kit enclosure system 130 and may use the empty process kit ring adaptor to remove the process kit ring from the process kit enclosure system 130 to transport the process kit ring secured to the process kit ring adaptor within the processing system 100.

In some embodiments, an empty process kit ring adaptor is stored in the process kit enclosure system 130. Factory interface robot 111 may retrieve the empty process kit ring adaptor, which may then be transferred to degassing chamber 104a, 104b, to transfer chamber robot 112, and into a process chamber 107. A used process kit ring may then be placed on the process kit ring adaptor, and the process kit ring plus the process kit ring adaptor may then be transferred to degassing chamber 104a, 104b, back to factory interface robot 111, and into the process kit enclosure system 130.

Figure 2A:
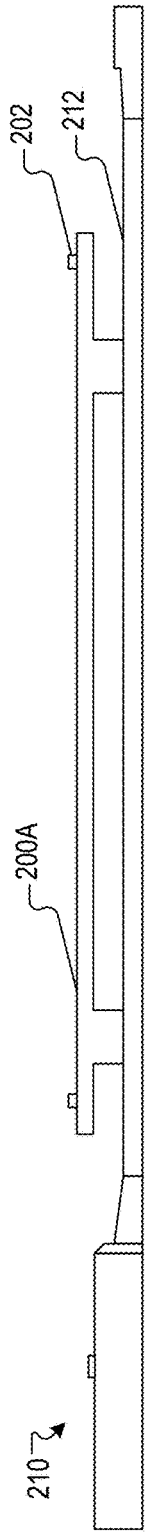
FIG. 2A illustrates a side view of a process kit ring adaptor on an end effector, according to certain embodiments.
Figure 2B:
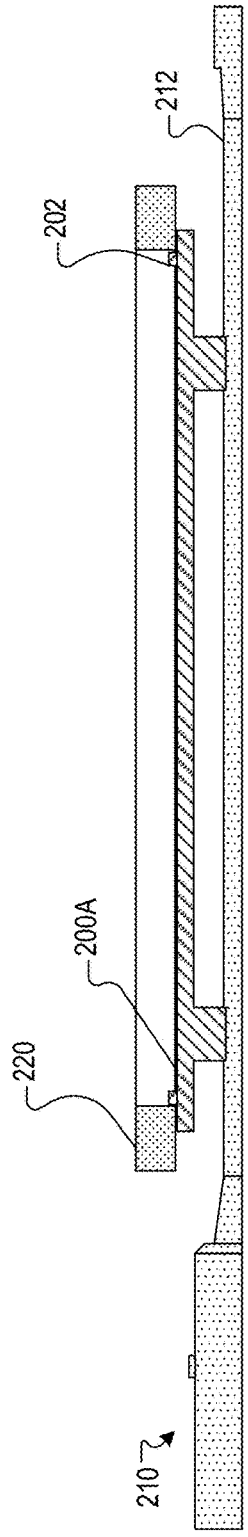
FIG. 2B illustrates a cross-sectional view of a process kit ring on a process kit ring adaptor, according to certain embodiments.
Figure 2C:
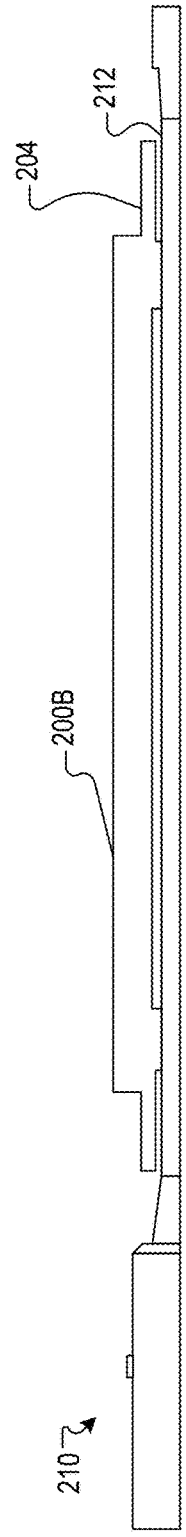
FIG. 2C illustrates a side view of a process kit ring adaptor on an end effector, according to certain embodiments.
Figure 2D:
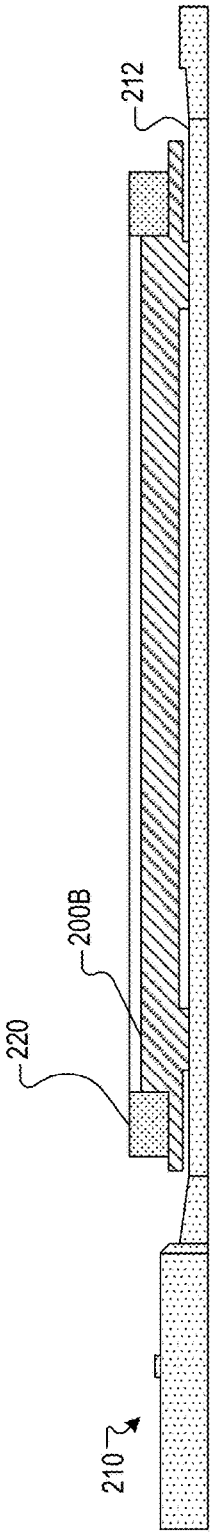
FIG. 2D illustrates a cross-sectional view of a process kit ring on a process kit ring adaptor, according to certain embodiments.

FIGS. 2A-D illustrate views of process kit ring adaptors 200 on an end effector 212 of a robot arm 210 for transfer of a process kit ring 220, according to certain embodiments. Although a single process kit ring 220 is illustrated in FIGS. 2B and 2D, one or more process kit rings 220 may be disposed on each process kit ring adaptor 200. For example, two or three process kit rings 220 may be nested within each other (e.g., a first process kit ring of a first diameter, a second process kit ring of a second diameter sized to fit within the first process kit ring, and a third process kit ring of a third diameter sized to fit within the second process kit ring) on the process kit ring adaptor 200. Automation elements, such as a robot arm 210, may be used for automated transfer (e.g., insertion to and removal from) of a process kit ring 220 between a process chamber of a wafer processing system and a process kit enclosure system (e.g., FOUP). The process kit ring adaptor 200 may be a mechanical intermediate adaptor (e.g., carrier) allowing the process kit ring 220 to be held, maneuvered, and removed from the processing chamber using existing automation elements (e.g., end effector 212 of robot arm, wafer pins, elements designed for wafer handling, etc.). The process kit ring adaptor 200 may be provided between the end effector 212 and the process kit ring 220. The process kit ring 220 may be constrained in x-translation, y-translation, and z-rotation by features (e.g., one or more pin contacts 202, one or more recesses 204, etc.) of the process kit ring adaptor 200. The process kit ring 220 may be constrained in z-translation, x-rotation, and y-rotation by gravity. Features (e.g., extrusions, inserts, etc.) may be disposed on the lower surface of the process kit ring 220 to maintain the lower surface elevated above the portion of the end effector 212 below the process kit ring adaptor 200.

FIG. 2A illustrates a side view of a process kit ring adaptor 200A on an end effector 212, according to certain embodiments. FIG. 2B illustrates a cross-sectional view of a process kit ring 220 on a process kit ring adaptor 200A, according to certain embodiments. The process kit ring 220 may be disposed on the process kit ring adaptor 200A (e.g., an approximately planar upper surface of the process kit ring adaptor 200A) in a stacked configuration. The process kit ring adaptor 220A may have one or more pin contacts 202 (e.g., extrusions, protrusions, inserts, etc.) on an upper surface of the process kit ring adaptor 220A (e.g., disposed on, inserted into the upper surface, etc.). The one or more pin contacts 202 may be proximate a portion of the upper surface proximate the perimeter that is to support the process kit ring 220. A sidewall of the one or more pin contacts 202 may be in contact with the process kit ring 220 responsive to the process kit ring 220 being disposed on the process kit ring adaptor 200A. The one or more pin contacts 202 may be used to prevent movement (e.g., horizontal movement) of the process kit ring 220 on the process kit ring adaptor 200A (e.g., constrain the process kit ring 220 in x-translation, y-translation, and z-rotation or yaw rotation).

In some embodiments, two or more pin contacts 202 located substantially opposite to each other are located on the upper surface of the process kit ring adaptor 200A and are used to prevent translational and/or rotational movement of the process kit ring 220.

FIG. 2C illustrates a side view of a process kit ring adaptor 200B on an end effector 212, according to certain embodiments.

FIG. 2D illustrates a cross-sectional view of a process kit ring 220 on a process kit ring adaptor 200B, according to certain embodiments. The process kit ring 220 may be disposed on the process kit ring adaptor 200B in an embedded configuration (e.g., in the recesses 204). The process kit ring adaptor 220B may have one or more recesses 204 (e.g., extrusions, inserts, etc.) on an upper surface of the process kit ring adaptor 220B. The one or more recesses 204 may be proximate a portion of the upper surface proximate the perimeter that is to support the process kit ring 220. The one or more recesses 204 may be sized and shaped to receive the process kit ring 220. A substantially horizontal surface and/or a substantially vertical surface of the one or more recesses 204 may be in contact with the process kit ring 220 responsive to the process kit ring 220 being disposed on the process kit ring adaptor 200B. The one or more recesses 204 may be used to prevent movement (e.g., horizontal movement) of the process kit ring 220 on the process kit ring adaptor 200B (e.g., constrain the process kit ring 220 in x-translation, y-translation, and z-rotation).

In some embodiments, two or more recesses 204 are located substantially opposite to each other (e.g., proximate curved portions of the perimeter of the process kit ring adaptor 200B) and are used to prevent movement of the process kit ring 220.

FIG. 3A illustrates a cross-sectional view of a pin contact 302 (e.g., pin contact 202 of FIGS. 2A-B) on a process kit ring adaptor 300A (e.g., process kit ring adaptor 200A of FIGS. 2A-B), according to certain embodiments. In some embodiments, the pin contact 302 may be a polyethylene terephthalate (PET) insert. In some embodiments, there are three pin contacts 302. The sidewall of the pin contact 302 may be sloped (e.g., narrower further away from the process kit ring adaptor 300A and wider closer to the process kit ring adaptor 300A, a sloped sidewall). A portion of the sidewall proximate the top of the pin contact 302 may be curved (e.g., tapered). A draft angle of the sloped sidewall may allow for the process kit ring 320 to have error upon being lowered onto the process kit ring adaptor 300A and may guide the process kit ring 320 into place (e.g., to a target position at the first distal portion of the upper surface of the carrier). The sidewall of the pin contact 302 may have a first coefficient of friction (e.g., low coefficient of friction) to allow sliding on entry. A substantially horizontal surface of the pin contact 302 on which the process kit ring 320 is disposed (e.g., proximate the sidewalls of the pin contact 302) may have a second coefficient of friction (e.g., a high coefficient of friction, a coefficient of friction that is higher than the first coefficient of friction of the sidewalls) to prevent sliding and shifting (e.g., to prevent horizontal movement) of the process kit ring 320 during automated transfers (e.g., on the end effector of the robot arm) and during transportation of the process kit enclosure system (e.g., FOUP).

FIG. 3B illustrates a cross-sectional view of a process kit ring adaptor 300B that forms a recess 304 (e.g., notch), according to certain embodiments. The recess 304 may have a substantially horizontal surface to support the bottom surface of the process kit ring 320. The recess 304 may have a sloped sidewall (e.g., have a draft angle, a guide taper) to allow for the process kit ring 320 to have error upon being lowered onto the process kit ring adaptor 300B and may guide the process kit ring 320 into place.

FIG. 3C illustrates a cross-sectional view of a process kit ring adaptor 330C that interfaces with an end effector, according to certain embodiments. The end effector 212 may form one or more recesses and a lower surface of the process kit ring adaptor 330C may form one or more features (e.g., extrusions, etc.) that are sized and shaped (e.g., cone shape, dowel shape, etc.) to interface with the end effector 312 (e.g., to prevent movement of the process kit ring adaptor 300C on the end effector 312). The sidewall of the feature or the sidewall of the recess may be sloped (e.g., a guide taper) to allow for alignment error (e.g., upon lowering the process kit ring adaptor 300C onto the end effector 312 or lifting the end effector 312 to raise the process kit ring adaptor 300C).

In addition to or as an alternative to a recess in the end effector 312, a feature (e.g., extrusion, pin contact, etc.) may be disposed on the end effector (e.g., on the horizontal surface of the recess, on the upper surface of the end effector) that aligns with a recess in the lower surface of the process kit ring adaptor 300C.

FIG. 3D illustrates a cross-sectional view of a process kit ring adaptor 300D that interfaces with an end effector 312, according to certain embodiments. One or more mechanical safety guides 306 (e.g., protrusion, pin contact, etc.) may be disposed on a lower surface of the process kit ring adaptor 300D. A mechanical safety guide 306 may interface with a recess 316 formed by an upper surface of the end effector 312. The mechanical safety guide 306 interfacing with a recess 316 may allow for alignment error (e.g., upon lowering the process kit ring adaptor 300C onto the end effector 312 or lifting the end effector 312 to raise the process kit ring adaptor 300C). The mechanical safety guide 306 interfacing with a recess 316 may prevent movement of the process kit ring adaptor 300D (e.g., not slip off end effector 312 despite vibration of the end effector 312).

FIG. 3E illustrates a cross-sectional view of a process kit ring adaptor 300E (e.g., lift pin interface) that interfaces with a lift pin 318 (e.g., carrier lift pin, wafer lift pin), according to certain embodiments. The lift pin 318 may be a wafer lift pin (e.g., used for lifting wafers in process chambers). A receptacle 319 may be formed in a lower surface of the process kit ring adaptor 300E to receive the lift pin 318. The receptacle 319 includes a body 330 having a cylindrical shape and a flared base 331 at one end of the body 330. In some embodiments, the body 330 is disposed through the process kit ring adaptor 300E and in some embodiments, the body is embedded in the lower surface of the process kit ring adaptor 300E (e.g., does not extend through). The flared base 331 may be partially positioned in and contact a counterbore formed on a lower surface of the process kit ring adaptor 300E. The receptacle 319 may include a first recess 332 extending into the body 330 and a counterbore 333 formed in the flare base 331. The recess 332 and the counterbore 333 may be coupled by a tapering sidewall 334 to facilitate feature engagement (e.g., engagement with lift pin 318). In one example, the recess 222 has an oblong or parabolic shape to accommodate a diametrical alignment feature. In such an example, the recess 332 may have a greater width in a direction parallel to the two substantially parallel edges of the perimeter of the process kit ring adaptor 300E (as opposed to a direction perpendicular to the two substantially parallel edges). The parabolic or oblong shape of the recess 332 may facilitate accommodation of the lift pin 318 within the recess 332.

Figure 4A:
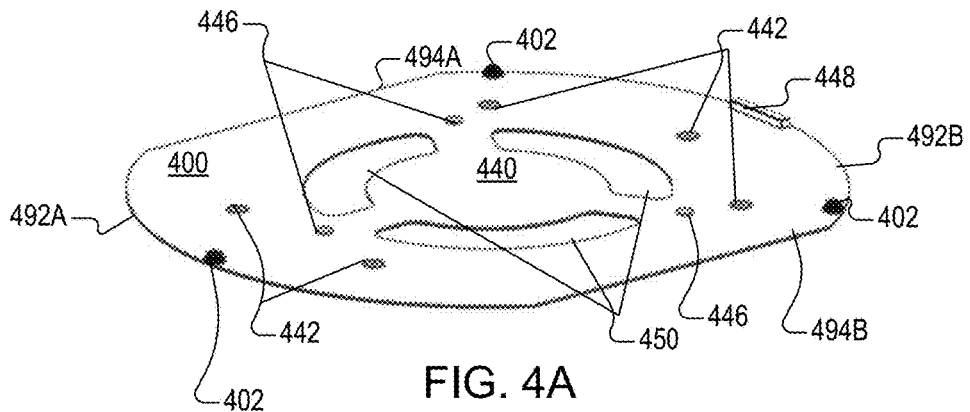
FIG. 4A illustrates a perspective view of a process kit ring adaptor, according to certain embodiments.

FIG. 4A illustrates a perspective view of an upper surface of a process kit ring adaptor 400 (e.g., one or more of process kit ring adaptor 200A of FIGS. 2A-B, process kit ring adaptor 300A of FIG. 3A, etc.), according to certain embodiments. The process kit ring adaptor 400 may have a rigid carrier (e.g., plate) made out of carbon fiber. The perimeter of the process kit ring adaptor may include first and second curved portions 492A-B and first and second flat portions 494A-B. The first and second flat portions 494A-B may be sized and shaped to avoid interference with process kit ring lift pins.

The process kit ring adaptor 400 may have one or more pin contacts 402 for preventing movement of a process kit ring 420 disposed on the process kit ring adaptor 400. In some embodiments, the pin contacts 402 are made of polyethylene terephthalate (PET). In some embodiments, the pin contacts 402 are used for supporting the process kit ring and centering the process kit ring on the process kit ring adaptor 400.

A central region 440 of the process kit ring adaptor 400 may be solid (e.g., planar, smooth, not perforated, etc.) to be compatible with a vacuum chuck of an aligner or other station. The lower surface of the central region may interface (e.g., via a vacuum interface, seal to, etc.) with the vacuum chuck for rotation and alignment of the process kit ring adaptor 400 and/or a process kit ring.

One or more friction pads 442 may be disposed on the process kit ring adaptor 400 to interface with one or more of a top surface of the vacuum chuck or a top surface of the end effector of a robot arm. In some embodiments, the friction pads 442 are embedded in or disposed on the lower surface of the process kit ring adaptor 400 to provide friction between the lower surface of the process kit ring adaptor 400 and the top surface of the vacuum chuck and/or the top surface of the end effector. In some embodiments, the friction pads 442 pass through the process kit ring adaptor 400 to provide friction between the lower surface of the process kit ring adaptor 400 and the top surface of the vacuum chuck and/or the top surface of the end effector. The one or more friction pads 442 may provide clearance to avoid interference with features (e.g., blade fang, wafer contract pads, plunger, and wrist) of the end effector 412. The friction pads 442 may be a polymer (e.g., viscous fluorinated polymer) and may be resistant to corrosive materials.

One or more kinematic inserts 446 (e.g., body 330 forming receptacle 319 of FIG. 3E) may be made of PET and may be used for theta alignment on lift pins (e.g., lift pin 318 of FIG. 3E). The kinematic inserts 446 may pass through the process kit ring adaptor 400 or may be disposed on or embedded in the lower surface of the process kit ring adaptor 400.

A flat insert 448 may be made of PET and may be used to align theta angle of process kit rings (e.g., theta angle alignment feature). The flat insert 448 may interface with a flat portion of the inner sidewall of a process kit ring. The flat insert 448 may be used by the aligner for alignment of the process kit ring adaptor 400 and/or a process kit ring.

The process kit ring adaptor 400 may form one or more plate openings 450 to reduce weight of the process kit ring adaptor 400.

Figures 4B, 4C:
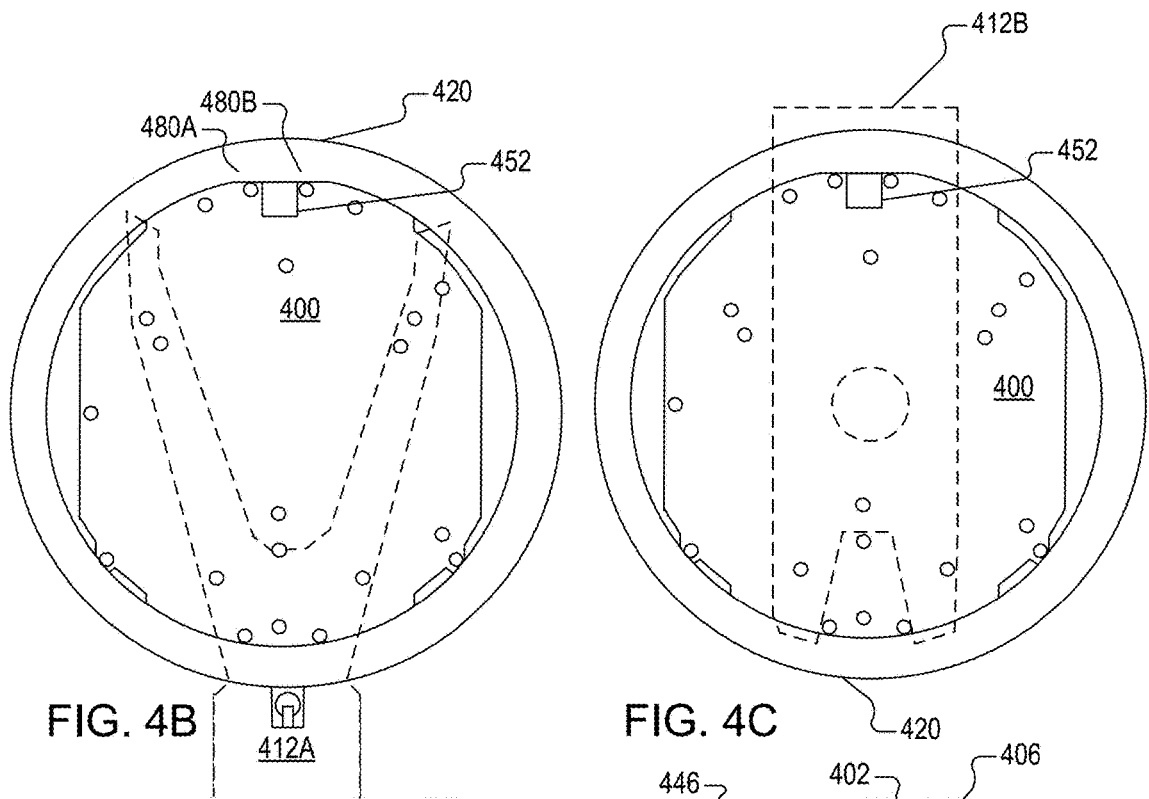
FIG. 4B illustrates a top view of a process kit ring disposed on a process kit ring adaptor that is disposed on an end effector, according to certain embodiments.
FIG. 4C illustrates a top view of a process kit ring disposed on a process kit ring adaptor that is disposed on an end effector, according to certain embodiments.

FIG. 4B illustrates a top view of a process kit ring 420 disposed on a process kit ring adaptor 400 that is disposed on a first end effector 412A, according to certain embodiments. FIG. 4C illustrates a top view of a process kit ring 420 disposed on a process kit ring adaptor 400 that is disposed on a second end effector 412B, according to certain embodiments. The process kit ring adaptor 400 may have first features (e.g., friction pads 442) that align with end effectors 412A-B of different sizes and from different orientations. The process kit ring adaptor 400 may have second features (e.g., kinematic insert 446) that are not blocked by one or more end effectors 412A-B from one or more orientations (e.g., for receiving lift pins to lift the process kit ring adaptor 400 and process kit ring 420 off of the end effector 412). In some embodiments, instead of a flat insert 448, the process kit ring adaptor 400 may form a slot 452 to be used by the aligner for alignment of the process kit ring adaptor 400 and/or a process kit ring 420. A different pin contact 480A, 480B may be disposed on either side of the slot 452. The pin contacts 480A, 480B may be used to align a flat interior sidewall surface or other registration feature of the process kit ring 420 to the process kit ring adaptor 400. In some embodiments, the slot 452 may have a length that corresponds to the length of the flat or other registration feature of the process kit ring 420 (e.g., the slot may extend to the surfaces where the pin contacts 480A, 480B are shown in FIGS. 4B-4C, the process kit ring adaptor 400 may not have pin contacts 480A, 480B). In some embodiments, the process kit ring enclosure system has one or more features (e.g., pin contacts) that fit within the slot 452 to engage with the flat or other registration feature of the process kit ring 420 to limit movement. The one or more features of the process kit ring enclosure system may be sized and located relative to the process kit ring 420 similar to how pin contacts 480A, 480B are sized and located relative to the process kit ring 420 in FIGS. 4B-4C. The slot 452 may be sized for an aligner device to locate the process kit ring 420 and/or the process kit ring adaptor 400 using the slot 452 (e.g., capture an image via the slot 452, determine a distance via the slot 452).

The process kit ring adaptor 400 may be sized and shaped to provide one or more gaps between the process kit ring 420 and one or more curved portions of the perimeter of the process kit ring adaptor 400. The one or more gaps may be used by the aligner device for alignment of the process kit ring adaptor 400 and/or a process kit ring 420. In particular, the one or more gaps (e.g., the slot 452) may enable a light beam to be used to detect the flat or other registration feature in the process kit ring 420.

The end effectors 412 may not cover the lower surface of the central region 440 (e.g., a vacuum chuck may interface with the central region 440 of the process kit ring adaptor 400 while the process kit ring adaptor 400 is on or above the end effector 412).

Figure 4D:
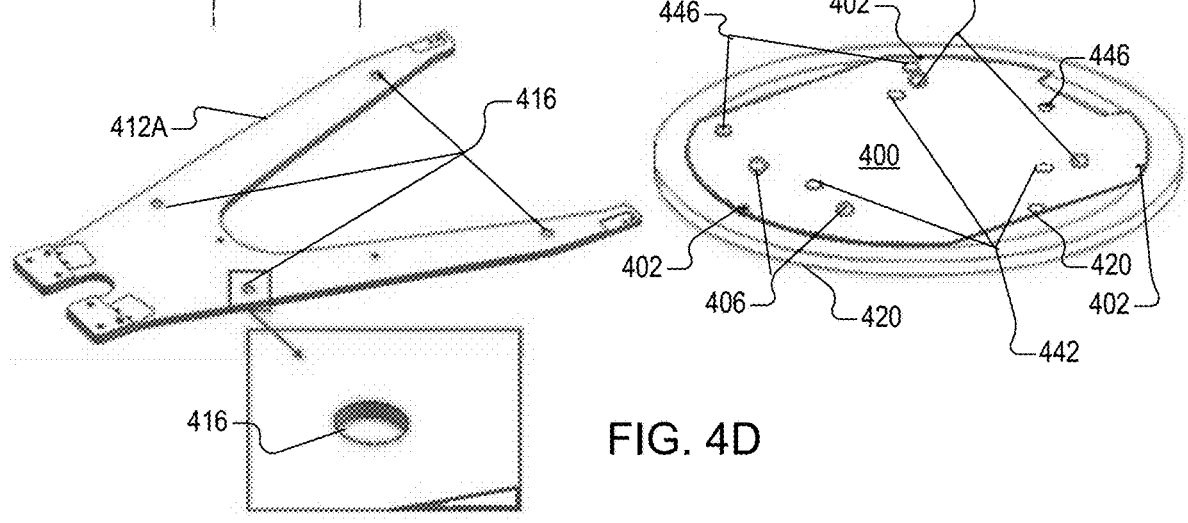
FIG. 4D illustrates a bottom view of a process kit ring on a process kit ring adaptor and a top view of an end effector, according to certain embodiments.

FIG. 4D illustrates a bottom view of a process kit ring 420 on a process kit ring adaptor 400 and a top view of an end effector 412A, according to certain embodiments. Mechanical safety guides 406 (e.g., mechanical safety guides 306 of FIG. 3D) may be coupled to a lower surface of the process kit ring adaptor 400. An upper surface of end effector 412 may form recesses 416 (e.g., recess 316 of FIG. 3D). The mechanical safety guides 406 may be sized, shaped, and located to interconnect with (e.g., fit within) the recesses 416. In some embodiments, the end effector 412A has recesses 416 that interconnect with extrusions (e.g., mechanical safety guides 406, feet) of the process kit ring adaptor 400. In some embodiments, the end effector 412A has extrusions (e.g., pads, feet) that interconnect with recesses in the process kit ring adaptor 400. The lower surface of the process kit ring adaptor 400 may include friction pads 442 that interface with the upper surface of the end effector 412 responsive to the mechanical safety guides 406 interconnecting with the recesses 416. The friction pads 442 may prevent movement of the process kit ring adaptor 400 in relation to the end effector 412A. The friction pads 442 may keep the lower surface of the process kit ring adaptor 400 a threshold distance from the upper surface of the end effector 412A (e.g., to prevent the process kit ring adaptor 400 from touching raised portions of the end effector 412A or robot arm). The lower surface of the process kit ring adaptor may have kinematic inserts 446 (e.g., receptacle 319 of FIG. 3E) that are not above the end effector 412 responsive to the mechanical safety guides 406 interconnecting with the recesses 416. The kinematic inserts 446 may be sized, shaped, and located to engage with lift pins (e.g., carrier lift pins, wafer lift pins, etc. The pin contacts 402 may pass through the process kit ring adaptor 400 or may be disposed on (e.g., embedded in) the upper surface of the process kit ring adaptor 400.

Figure 5A:
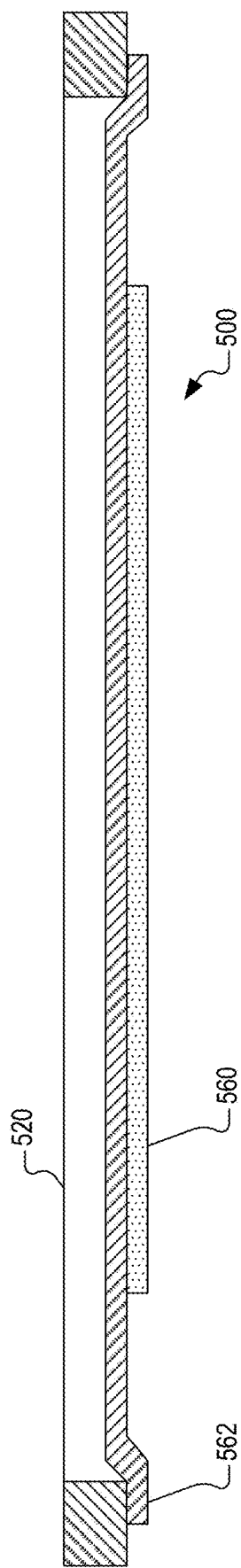
FIG. 5A illustrates a cross-sectional view of a process kit ring adaptor, according to certain embodiments.
Figure 5B:
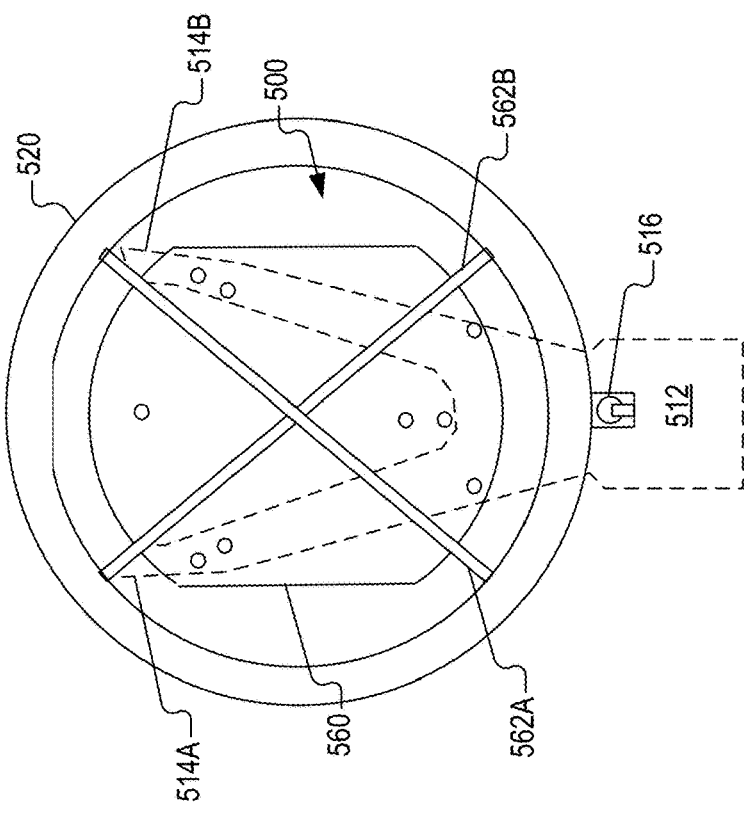
FIG. 5B illustrates a top view of a process kit ring adaptor on an end effector, according to certain embodiments.

FIG. 5A illustrates a cross-sectional view of a process kit ring adaptor 500, according to certain embodiments. FIG. 5B illustrates a top view of a process kit ring adaptor 500 on an end effector 512, according to certain embodiments. The process kit ring adaptor 500 may include a plate 560 and one or more reinforcement structures 562 (e.g., a first reinforcement structure 562A and a second reinforcement structure 562B). The process kit ring adaptor 500 including a plate 560 and one or more reinforcement structures 562 may have a larger vertical cross section than a process kit ring adaptor without reinforcement structures 562. The larger vertical cross section may provide increased vertical support and may reduce weight while maintaining same strength. Due to the one or more reinforcement structures 562, the plate 560 may be thinner than a process kit ring adaptor without reinforcement structures 562. Distal ends of the one or more reinforcement structures 562 may form a recess (e.g., have a hook that forms a recess) to hold the process kit ring 520 (e.g., see recess 304 of FIG. 3B). The torsional rigidity of the process kit ring adaptor 500 may be reinforced by the plate 560 (e.g., a plate 560 made of carbon fiber sheet). The one or more reinforcement structures 562 may be made by a single machining operation to provide precise positional tolerance.

Distal ends 514A-B of the end effector 512 may grip the edge of the plate 560 of the process kit ring adaptor 500. A movement device 516 may push against the process kit ring 520 which pushes against the process kit ring 520 to engage the plate 560 with the distal ends 514A-B (e.g., to provide gripping of the plate 560 by the distal ends 514).

Reinforcement structure 562 may have a square or rectangular cross-section. The cross-section of each of the reinforcement structures 562 may be the same or substantially similar. The reinforcement structures 562 may include reinforcement structure 562A and reinforcement structure 562B that intersect at middle portions of the reinforcement structures 562A-B.

Figure 6A:
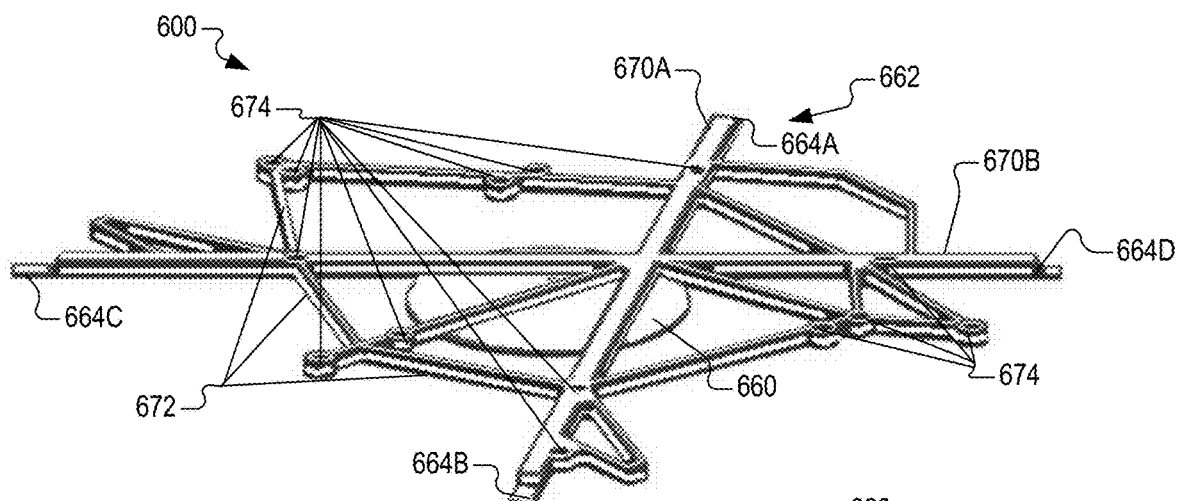
FIG. 6A illustrates a perspective view of a process kit ring adaptor, according to certain embodiments.
Figure 6B:
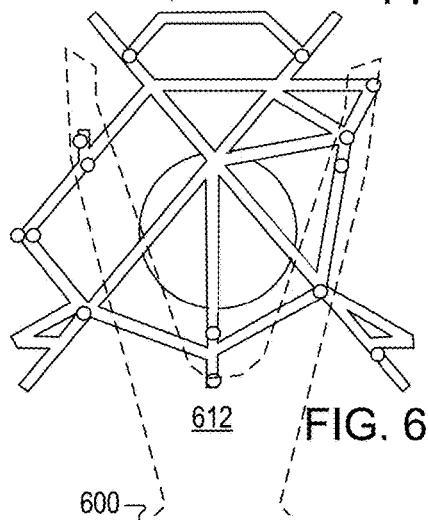
FIG. 6B illustrates a top view of a process kit ring adaptor on an end effector, according to certain embodiments.

FIG. 6A illustrates a perspective view of a process kit ring adaptor 600, according to certain embodiments. FIGS. 6B-E illustrate top views of a process kit ring adaptors 600 on an end effector 612, according to certain embodiments.

Process kit ring adaptor 600 may include a vacuum interface structure 660 (e.g., a plate 560 that is sized to interface with the vacuum chuck, a plate 560 without any features). The process kit ring adaptor 600 may include a reinforcement structure 662 that has a lower surface that is coupled to an upper surface of the vacuum interface structure 660. The reinforcement structure 662 may include distal ends 664 that form recesses for supporting the process kit ring 620. The reinforcement structure 662 may include features 674 (e.g., insert structures such as mechanical safety guide 306 of FIG. 3D, receptacle 319 of FIG. 3E, friction pads 442 and kinematic inserts 446 of FIG. 4A, etc.). The reinforcement structure 662 may include a first structural component 670A that extends from a first distal end 664A that forms a first recess to a second distal end 664B that forms a second recess, where the process kit ring 620 is disposed in the first and second recesses. The reinforcement structure 662 may include a second structural component 670B that extends from a third distal end 664C that forms a third recess to a fourth distal end 664D that forms a fourth recess, where the process kit ring 620 is disposed in the first, second, third, and fourth recesses.

The reinforcement structure 662 may include additional structural components 672. One or more of the additional structural components 672 may extend from one or both of the first and second structural components 670A-B to the features 674 (e.g., mechanical safety guide 306 of FIG. 3D, receptacle 319 of FIG. 3E, friction pads 442 and kinematic inserts 446 of FIG. 4A, etc.). One or more of the additional structural components may be used as an alignment feature or for balancing the rest of the reinforcement structure 662.

The first and second structural components 670A-B may each have a first cross section and the additional structural components 672 may each have a second cross section. The first cross section and the second cross section may be square or rectangular. The first cross section may be greater than the second cross section. The process kit ring adaptor 600 may avoid process kit ring lift pins. The process kit ring adaptor 600 may be lighter weight and use less material than a process kit ring adaptor that does not have a reinforcement structure.

Figure 6C:
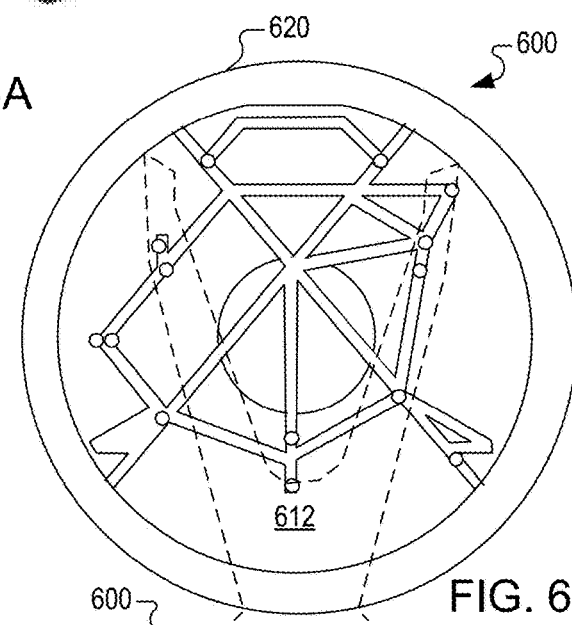
FIG. 6C illustrates a top view of a process kit ring adaptor on an end effector, according to certain embodiments.
Figure 6D:
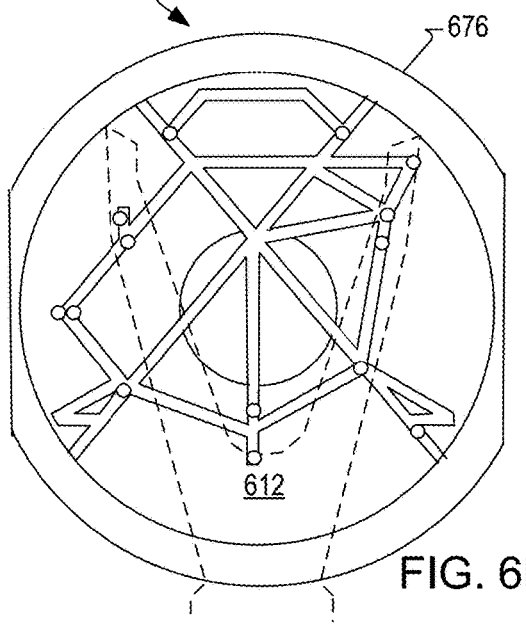
FIG. 6D illustrates a top view of a process kit ring adaptor on an end effector, according to certain embodiments.
Figure 6E:
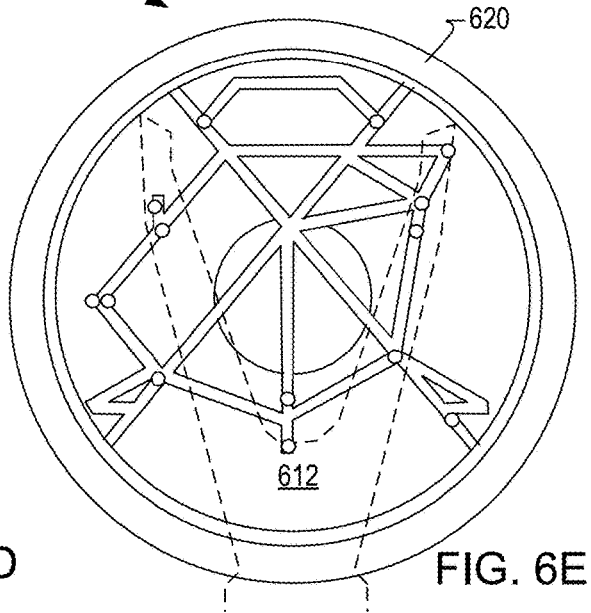
FIG. 6E illustrates a top view of a process kit ring adaptor on an end effector, according to certain embodiments.

In some embodiments, the process kit ring 620 may be disposed directly on the process kit ring adaptor 600 (e.g., see FIG. 6C). In some embodiments, a support structure 676 may be disposed on the distal ends 664 of the reinforcement structure 662 of the process kit ring adaptor 600 (e.g., see FIG. 6D). The support structure may form a circular inside perimeter and an outside perimeter that includes a first curved edge, a second curved edge opposite the first curved edge, a first parallel edge and a second parallel edge that is substantially parallel to the first parallel edge. The parallel edges may be used to enter narrow openings (e.g., narrow load lock openings) and exit narrow openings (e.g., clearance to retract the process kit ring adaptor 600 from the processing chamber after lifting the process kit ring 620 off of the process kit ring adaptor 600). The process kit ring 620 may be disposed on the support structure 676 (e.g., see FIG. 6E).

Figure 7A:
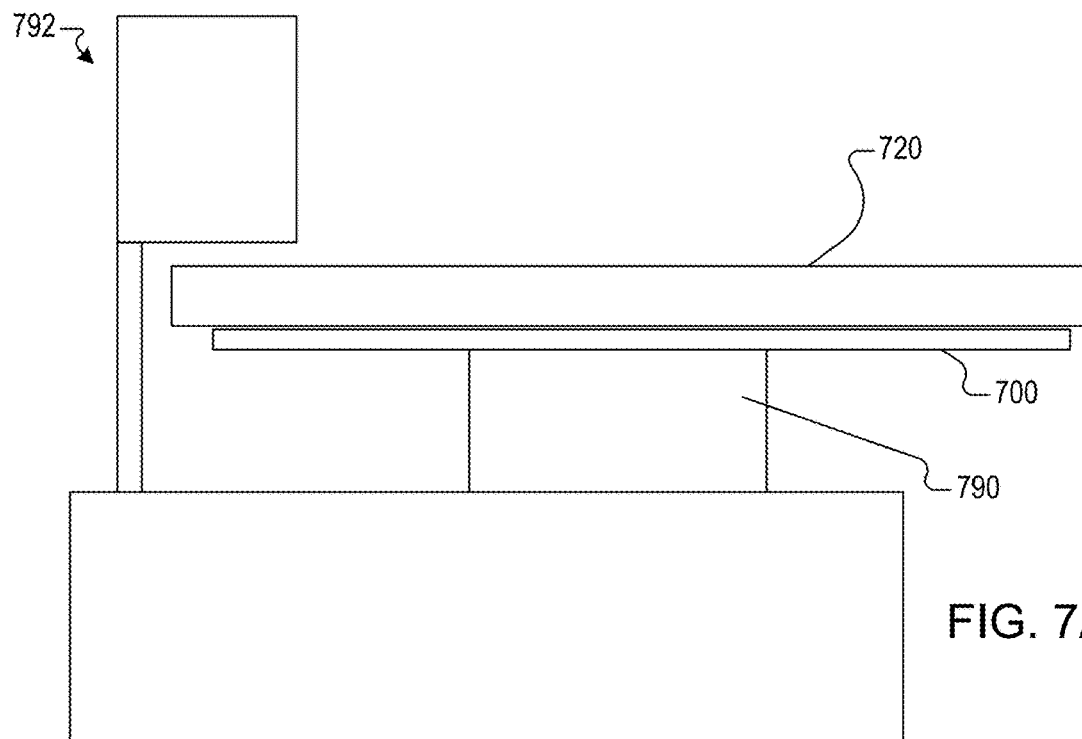
FIG. 7A illustrates a side view of a process kit ring disposed on a process kit ring adaptor secured to a vacuum chuck, according to certain embodiments.
Figure 7B:
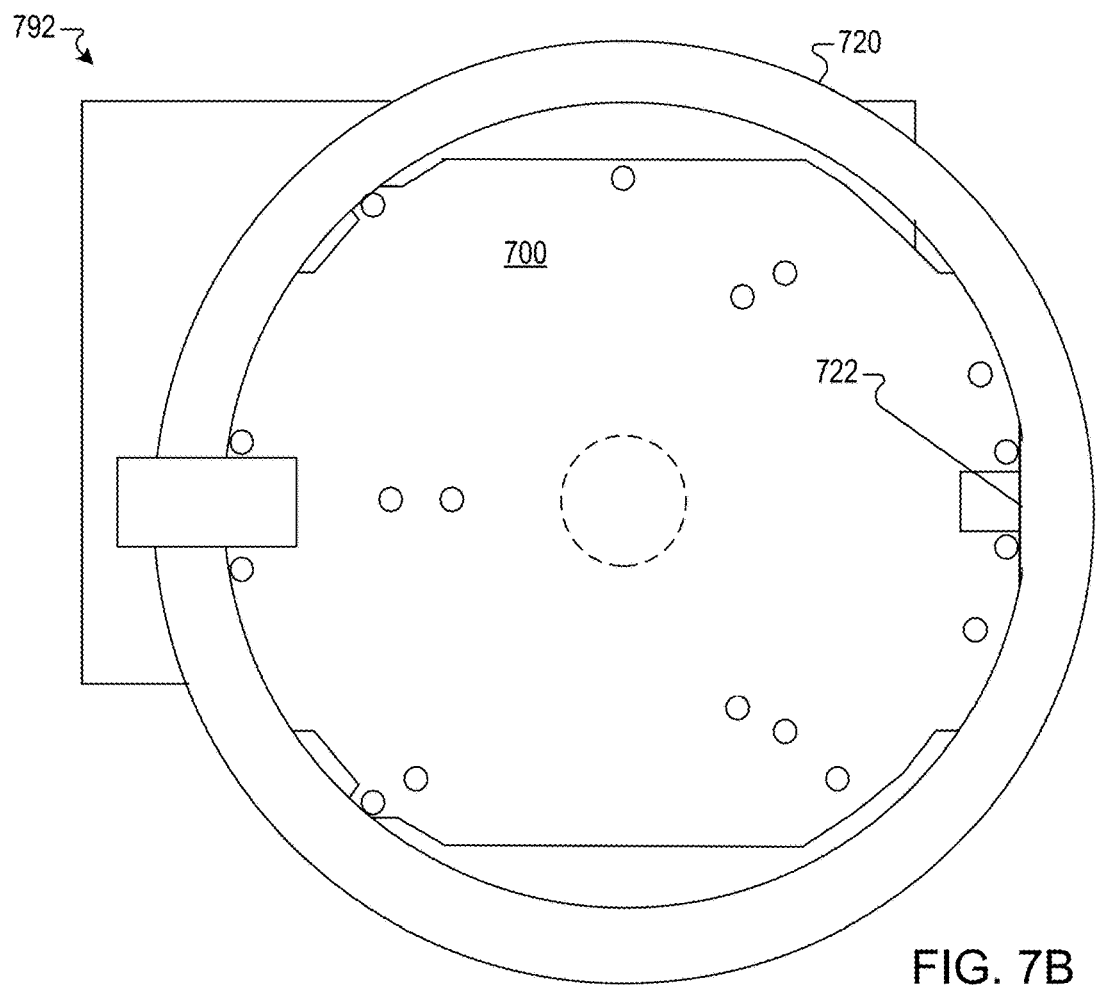
FIG. 7B illustrates a top view of a process kit ring disposed on a process kit ring adaptor secured to a vacuum chuck, according to certain embodiments.

FIG. 7A illustrates a side view of a process kit ring 720 disposed on a process kit ring adaptor 700 secured to a vacuum chuck 790 of an aligner device 792, according to certain embodiments. FIG. 7B illustrates a top view of a process kit ring 720 disposed on a process kit ring adaptor 700 secured to a vacuum chuck 790 of an aligner device 792, according to certain embodiments. The end effector of the robot arm may place the process kit ring 720 disposed on the process kit ring adaptor 700 on the vacuum chuck 790. The vacuum chuck 790 may interface with the lower surface of the central region of the process kit ring adaptor 700. The process kit ring adaptor 700 may have one or more features (e.g., friction pads 442, etc.) to interface with the aligner device 792.

The vacuum chuck 790 may spin the process kit ring adaptor 700 and process kit ring 720 while scanning the process kit ring 720 for a flat inner wall 722 of the process kit ring 720 (e.g., flat angle) and while performing metrology inspection. The flat inner wall 722 may be a fiducial to provide camera-machine vision alignment. A portion of the perimeter of the process kit ring adaptor 700 may be flat to interface with the flat inner wall 722 of the process kit ring 720. The gaps between the process kit ring adaptor 700 and the process kit ring 720 may provide through beam clearance to detect the inside edge of the process kit ring 720.

FIGS. 8A-F illustrate a process kit ring adaptor 800 disposed on one or more fins 894 of a process kit enclosure system 830, according to certain embodiments. In some embodiments, the process kit ring adaptor 800 has a planar bottom surface on a first plane and has one or more features (e.g., extrusions, pads) that extend from the first plane. For example, the process kit ring adaptor 800 may have one or more pads that wrap from a side surface of the process kit ring adaptor 800 to a bottom surface of the process kit ring adaptor 800. Each fin 894 may have a recess (e.g., slot) to receive the feature (e.g., pad) of the process kit ring adaptor 800. In some embodiments, only the features of the process kit ring adaptor 800 engage with the fin (e.g., the planar bottom surface of the process kit ring adaptor 800 does not engage with the fins 894). In some embodiments, the recesses of the fins 894 (that receive the pads of the process kit ring adaptor 800) constrain movement of the process kit ring adaptor 800 in the x-direction and the y-direction.

FIG. 8A illustrates a cross-sectional view of a process kit ring adaptor 800 on a fin 894A of a process kit enclosure system 830, according to certain embodiments. FIG. 8B illustrates a cross-sectional view of a process kit ring 820 disposed on a process kit ring adaptor 800 on a fin 894A of a process kit enclosure system 830, according to certain embodiments. FIG. 8C illustrates a top view of retention devices 896 securing a process kit ring 820 disposed on a process kit ring adaptor 800 on a fin 894A of a process kit enclosure system 830, according to certain embodiments. The process kit ring adaptor 800 may be disposed on one or more fins 894 (e.g., two fins, three fins, four fins, etc.).

The fin 894A may form a recess to secure the process kit ring adaptor 800. The recess may be shaped to align, locate and capture the stack of the process kit ring on the process kit ring adaptor. The process kit ring adaptor 800 may have a pin contact to secure the process kit ring 820. In some embodiments, retention devices 896 may rotate to a secured position to retain the process kit ring 820 on the process kit ring adaptor 800 during transportation of the process kit enclosure system 830. In some embodiments, retention devices 896 may be placed in an unsecured position (e.g., rotated, rotated and removed, etc.) to transfer a process kit ring adaptor 800 and/or a process kit ring 820 on a process kit ring adaptor 800 into a processing system. In some embodiments, a retention device may pivot to secure the process kit ring adaptor 800 and/or process kit ring 820 responsive to a portion of the process kit ring adaptor 800 engaging with the retention device.

FIG. 8D illustrates a cross sectional view of a process kit ring adaptor 800 on a fin 894B of a process kit enclosure system 830, according to certain embodiments. FIG. 8E illustrates a cross sectional view of a process kit ring 820 disposed on a process kit ring adaptor 800 on a fin 894B of a process kit enclosure system 830, according to certain embodiments. FIG. 8F illustrates a top view of retention devices 896 securing a process kit ring 820 disposed on a process kit ring adaptor 800 on fins 894A and 894B of a process kit enclosure system 830, according to certain embodiments. The process kit ring adaptor 800 may be disposed on one or more fins 894A (e.g., one fin 894A, two fins 894A, three fins 894A, four fins 894A, etc.) and on one or more fins 894B (e.g., one fin 894B, two fins 894B, three fins 894B, four fins 894B, etc.).

The fin 894B may form a first recess to secure the process kit ring adaptor 800. The fin 894B may form a second recess to secure the process kit ring 820. Fin 894B may provide angular alignment (e.g., interfacing with the flat inner wall 722 of process kit ring) and may provide a retaining feature.

Retention devices 896 may rotate to a secured position to retain the process kit ring 820 on the process kit ring adaptor 800 during transportation of the process kit enclosure system 830.

FIGS. 8G-H illustrate cross sectional views of a process kit ring adaptor 800 and a fin 894 of a process kit enclosure system 830, according to certain embodiments. In some embodiments, the retention device 896 may be a pivoting clamp. When a processing kit adaptor 800 is not on the fin 894, the center of gravity of the retention device 896 may cause a clamp portion of the retention device 896 to be oriented to receive a process kit ring adaptor 800 (e.g., as shown in FIG. 8G, the clamp portion of the retention device 896 may be oriented upward). Upon lowering the process kit ring adaptor 800 (e.g., with or without a process kit ring 820 on the process kit ring adaptor 800) onto the fin 894, the process kit ring adaptor 800 may engage with the retention device 896 (e.g., with the clamp portion of the retention device 896) to cause the retention device 896 to pivot to a secured position (e.g., a first portion of the clamp portion of the retention device 896 above the process kit ring adaptor 800 and a second portion of the clamp portion of the retention device 896 below the process kit ring adaptor 800. In some embodiments, the clamp portion of the retention device 896 may be sized to receive one or more of the process kit ring adaptor 800 or the process kit ring 820 (e.g., the process kit ring 820 disposed on the process kit ring adaptor 800). The process kit ring adaptor 800 may have a one or more features (e.g., pad, foot, etc.), where a corresponding feature engages with each fin 894 (e.g., a recess of each fin 894). The one or more features may be the only portion of the process kit ring adaptor 800 that engage with the fins 894.

Figure 9A:
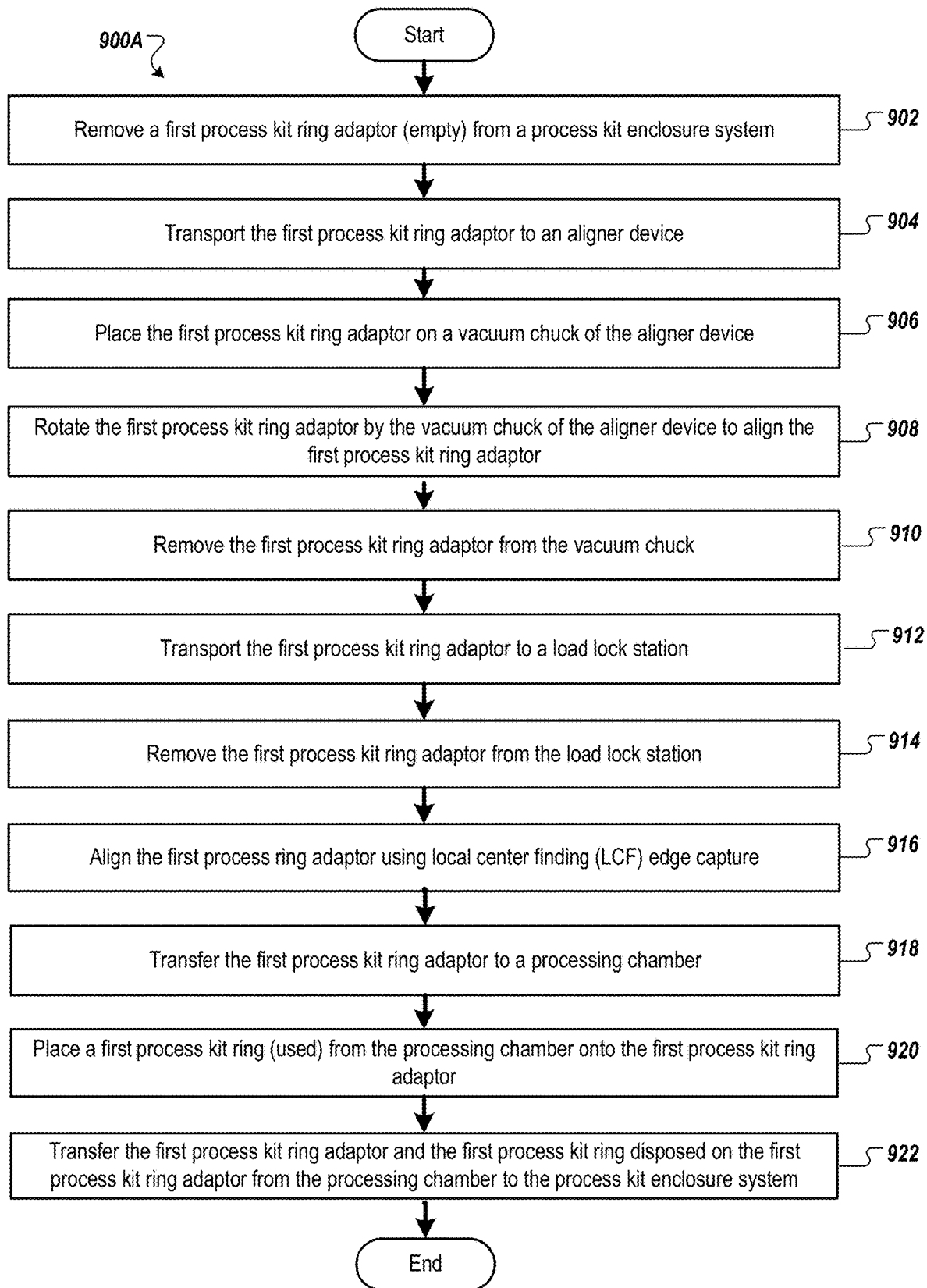
FIG. 9A-B illustrate methods for process kit ring replacement in processing chambers, according to certain embodiments.
Figure 9B:
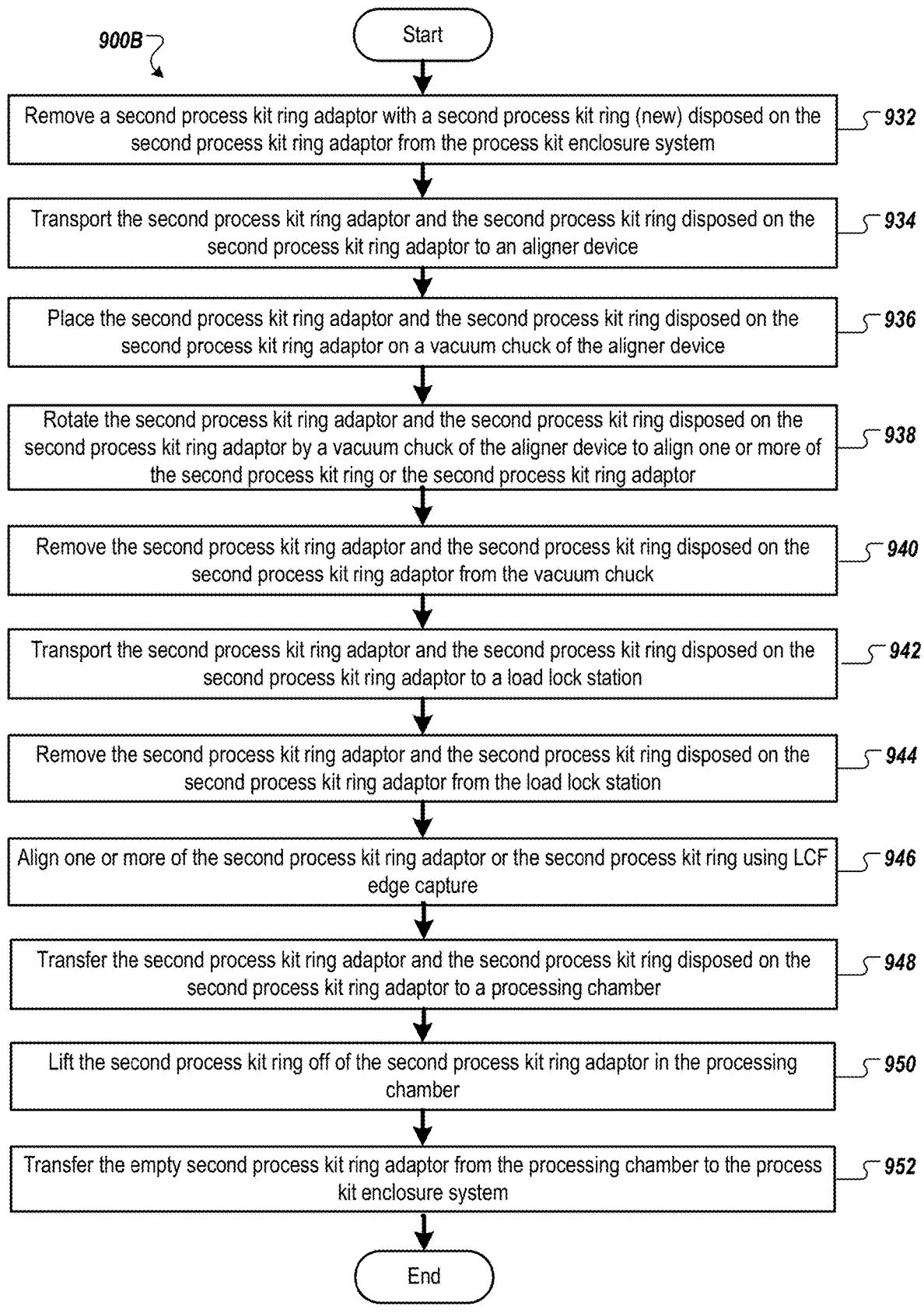

FIGS. 9A-9B illustrate methods 900A-B for process kit ring replacement in processing chambers, according to certain embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. In some embodiments, method 900B may follow method 900A.

Referring to FIG. 9A, at block 902, a first process kit ring adaptor (empty) is removed (e.g., by an end effector) from a process kit enclosure system (e.g., FOUP). The empty first process kit ring adaptor may be disposed in one of the lower slots in the process kit enclosure system. The first process kit ring adaptor may be disposed on fins (e.g., at two or more portions of the lower surface of the first process kit ring adaptor proximate the perimeter of the first process kit ring adaptor) within the process kit enclosure system. A corresponding upper surface of a distal end of each fin may form a recess that is shaped and sized to receive a corresponding portion (e.g., a pad disposed on a lower surface of the first process kit ring adaptor) proximate the perimeter of the first process kit ring adaptor. An end effector of a robot arm (e.g., factory interface robot) of a processing system may enter the process kit enclosure system below the first process kit ring adaptor between the fins on which the first process kit ring adaptor is supported. The end effector may lift to interface the upper surface of the end effector with a lower surface of the first process kit ring adaptor. The upper surface of the end effector may form recesses that interconnect with features (e.g., mechanical safety guides, protrusions, pin contacts, etc.) of the lower surface of the first process kit ring adaptor. The lower surface of the first process kit ring adaptor may have friction pads that contact the upper surface of the end effector. The end effector may lift the first process kit ring adaptor.

A first upper surface of the end effector may interface with a lower surface of the first process kit ring adaptor. The first process kit ring adaptor may be disposed on fins of a process kit enclosure system (e.g., FOUP). The first process kit ring adaptor may be retained on the fins in the process kit enclosure system via a retaining feature. The retaining feature may be placed in an unsecured position (e.g., rotated, removed, etc.) to remove the first process kit ring adaptor from the process kit enclosure system.

At block 904, the first process kit ring adaptor is transferred (e.g., by the end effector) to an aligner device.

At block 906, the first process kit ring adaptor is placed (e.g., by the end effector) on a vacuum chuck of an aligner device. The friction pads on the lower surface of the first process kit ring adaptor may interface with the aligner device. A planar central region (e.g., solid region) of the lower surface of the first process kit ring adaptor interfaces with the vacuum chuck. The end effector may place the first process kit ring adaptor on the vacuum chuck by aligning the planar central region of the first process kit ring adaptor above the vacuum chuck and lowering the planar central region of the first process kit ring adaptor on the vacuum chuck. The end effector may not cover the central region. The end effector may remain lowered below the first process kit ring adaptor or may be removed from below the first process kit ring adaptor.

At block 908, the first process kit ring adaptor is rotated by the vacuum chuck to align the first process kit ring adaptor. The aligner device may scan for one or more of: a slot of the first process kit ring adaptor; a protruding alignment feature of the first process kit ring adaptor; fiducials on the upper surface of the first process kit ring adaptor; etc.

The aligner device may scan the first process kit ring adaptor to locate a slot, registration feature, or fiducial of the first process kit ring adaptor. The first process kit ring adaptor may be shaped for a beam of a ribbon sensor to detect the slot, registration feature, or fiducial. In some embodiments, the aligner device (and/or an LCF device) may perform laser center finding (LCF) beam trajectories to perform LCF edge capture for x-y alignment of the first process kit ring adaptor. In some embodiments, the aligner device may perform machine vision alignment using fiducials disposed on distal edges of a second upper surface of the first process kit ring adaptor to align the first process kit ring adaptor.

At block 910, the first process kit ring adaptor is removed (e.g., lifted by the end effector of a factory interface robot) from the vacuum chuck (e.g., for first process kit ring replacement in a process chamber of the processing system). The features on the lower surface of the first process kit ring adaptor may interconnect with the recesses on the upper surface of the end effector and the friction pads on the lower surface of the first process kit ring adaptor may come in contact with the upper surface of the end effector.

At block 912, the first process kit ring adaptor is transported (e.g., by the end effector) to a load lock station. The end effector may place the first process kit ring adaptor on a support structure (e.g., lift pins interfacing with kinematic features on the lower surface of the first process kit ring adaptor, fins with recesses that interface with portions of the first process kit ring adaptor proximate the perimeter of the first process kit ring adaptor, etc.) of the load lock station.

At block 914, the first process kit ring adaptor is removed (e.g., picked up by a transfer robot) from the load lock station. In some embodiments, an end effector of the transfer robot lifts the first process kit ring adaptor from a support structure (e.g., lift pins interfacing with the kinematic features, fins interfacing with portions proximate the perimeter, etc.) of the load lock station. The features on the lower surface of the first process kit ring adaptor may interconnect with the recesses on the upper surface of the end effector of the transfer robot and the friction pads on the lower surface of the first process kit ring adaptor may come in contact with the upper surface of the end effector of the transfer robot.

At block 916, the first process kit ring adaptor is aligned using a local center finding (LCF) edge capture (e.g., via an LCF device). In some embodiments, prior to a process kit ring adaptor being transferred into a processing chamber and subsequent to the process kit ring adaptor being transferred out of a processing chamber, LCF edge capture is used to align one or more of the process kit ring adaptor or a process kit ring disposed on the process kit ring adaptor.

At block 918, the first process kit ring adaptor is transferred (e.g., by the transfer robot) to the processing chamber.

At block 920, a first process kit ring (used) is placed from the processing chamber onto the first process kit ring adaptor. For example, the first process kit ring may be lifted (e.g., via lift pins of the processing chamber) and the first process kit ring adaptor disposed on an end effector (e.g., of the transfer robot) may be moved to be under the first process kit ring adaptor. The lift rings may lower the first process kit ring onto the process kit ring adaptor that is on the end effector. The lift pins may be wafer lift pins. The lift pins may be processing kit ring lift pins. The end effector and the first process kit ring adaptor may be sized and shaped to not interfere with the lift pins. For example, the flat perimeter sides of the first process kit ring adaptor may allow the lift pins to interface with the lower surface of the first process kit ring.

At block 922, the first process kit ring adaptor and the first process kit ring disposed on the first process kit ring adaptor are transferred from the processing chamber to the process kit enclosure system. Block 922 may be similar to the reverse of blocks 902-918. For example, the first process kit ring disposed on the first process kit ring adaptor may be transferred by an end effector of a transfer robot, aligned via LCF edge capture, placed on a load lock station, removed (e.g., via an end effector of a factor interface robot) from the load lock station, transported to the aligner device, placed on the vacuum chuck, rotated to align one or more of the first process kit ring adaptor or the first process kit ring, removed from the vacuum chuck, transferred to the process kit enclosure system, and placed on a slot (e.g., above the empty process kit ring adaptors, below the new process kit rings disposed on process kit ring adaptors).

Referring to FIG. 9B, at block 932, a second process kit ring adaptor with a second process kit ring (new, unused) disposed on the upper surface of the second process kit ring adaptor is removed (e.g., by an end effector) from the process kit enclosure system (e.g., from a slot above one or more empty process kit ring adaptors and/or above one or more used process kit rings each disposed on a corresponding process kit ring adaptor). The second process kit ring adaptor may be disposed on fins (e.g., at two or more portions of the lower surface of the second process kit ring adaptor proximate the perimeter of the second process kit ring adaptor) within the process kit enclosure system. A corresponding upper surface of a distal end of each fin may form a recess that is shaped and sized to receive a corresponding portion of the perimeter of the second process kit ring adaptor. An end effector of a robot arm (e.g., factory interface robot) of a processing system may enter the process kit enclosure system below the second process kit ring adaptor between the fins on which the second process kit ring adaptor is supported. The end effector may lift to interface the upper surface of the end effector with a lower surface of the second process kit ring adaptor. The upper surface of the end effector may form recesses that interconnect with features (e.g., mechanical safety guides, protrusions, pin contacts, etc.) of the lower surface of the second process kit ring adaptor. The lower surface of the second process kit ring adaptor may have friction pads that contact the upper surface of the end effector. The end effector may lift the second process kit ring adaptor and second process kit ring disposed on the second process kit ring adaptor.

The second process kit ring may be disposed on a first distal end and a second distal end of the second process kit ring adaptor. A first upper surface of the end effector may interface with a lower surface of the second process kit ring adaptor. The second process kit ring adaptor may be disposed on fins of a process kit enclosure system (e.g., FOUP) and the second process kit ring may be disposed on the second process kit ring adaptor. The second process kit ring may be retained on the second process kit ring adaptor in the process kit enclosure system via a retaining feature (e.g., extrusion of the fin) inserted between the second process kit ring and the second process kit ring adaptor. The second process kit ring adaptor and second process kit ring may be removed from the retaining feature by the end effector raising the second process kit ring adaptor in a vertical direction.

At block 934, the second process kit ring adaptor and second process kit ring disposed on the second process kit ring adaptor are transported (e.g., by the end effector) to an aligner device.

At block 936, the second process kit ring adaptor and the second process kit ring disposed on the second process kit ring adaptor are placed (e.g., by the end effector) on a vacuum chuck of an aligner device. The friction pads on the lower surface of the second process kit ring adaptor may interface with the aligner device. A planar central region of the lower surface of the second process kit ring adaptor interfaces with the vacuum chuck. The end effector may place the second process kit ring adaptor on the vacuum chuck by aligning the planar central region of the second process kit ring adaptor above the vacuum chuck and lowering the planar central region of the second process kit ring adaptor on the vacuum chuck. The end effector may not cover the central region. The end effector may remain lowered below the second process kit ring adaptor or may be removed from below the second process kit ring adaptor.

At block 938, the second process kit ring adaptor and the second process kit ring disposed on the second process kit ring adaptor are rotated by the vacuum chuck to align the second process kit ring. The aligner device may scan for one or more of: the flat planar surface of the inner surface of the second process kit ring; a slot of the second process kit ring adaptor proximate the flat planar surface of the inner surface of the second process kit ring; a protruding alignment feature of the second process kit ring adaptor proximate the flat planar surface of the inner surface of the second process kit ring; fiducials on the upper surface of the second process kit ring adaptor; etc.

The aligner device may scan the second process kit ring to locate a registration feature disposed on an inside edge of the second process kit ring to align the second process kit ring. The second process kit ring adaptor is shaped to provide clearance between the inside edge of the second process kit ring and the second process kit ring adaptor such that a beam of a ribbon sensor will not be interrupted by the second process kit ring adaptor and can detect the registration feature of the second process kit ring. In some embodiments, the aligner device may perform laser center finding (LCF) beam trajectories to perform LCF edge capture for x-y alignment of the second process kit ring adaptor. In some embodiments, the aligner device may perform machine vision alignment using fiducials disposed on distal edges of a second upper surface of the second process kit ring adaptor to align the second process kit ring adaptor.

At block 940, the second process kit ring adaptor and second process kit ring disposed on the second process kit ring adaptor are removed (e.g., lifted by the end effector of a factory interface robot) from the vacuum chuck (e.g., for second process kit ring replacement in a process chamber of the processing system). The features on the lower surface of the second process kit ring adaptor may interconnect with the recesses on the upper surface of the end effector and the friction pads on the lower surface of the second process kit ring adaptor may come in contact with the upper surface of the end effector.

At block 942, the second process kit ring adaptor and second process kit ring disposed on the second process kit ring adaptor are transported (e.g., by the end effector) to a load lock station. The end effector may place the second process kit ring adaptor (e.g., with second process kit ring disposed on the second process kit ring adaptor) on a support structure (e.g., lift pins interfacing with kinematic features on the lower surface of the second process kit ring adaptor, fins with recesses that interface with portions of the second process kit ring adaptor proximate the perimeter of the second process kit ring adaptor, etc.) of the load lock station.

At block 944, the second process kit ring adaptor is removed (e.g., picked up) by a transfer robot from the load lock station. In some embodiments, an end effector of the transfer robot lifts the second process kit ring adaptor (e.g., with second process kit ring disposed on the second process kit ring adaptor) from a support structure (e.g., lift pins interfacing with the kinematic features, fins interfacing with portions proximate the perimeter, etc.) of the load lock station. The features on the lower surface of the second process kit ring adaptor may interconnect with the recesses on the upper surface of the end effector of the transfer robot and the friction pads on the lower surface of the second process kit ring adaptor may come in contact with the upper surface of the end effector of the transfer robot.

At block 946, one or more of the second process kit ring adaptor or the second process kit ring are aligned using LCF edge capture.

At block 948, the second process kit ring adaptor and the second process kit ring disposed on the second process kit ring adaptor are transferred (e.g., by the transfer robot) to the processing chamber.

At block 950, the second process kit ring is lifted (e.g., via lift pins) off of the second process kit ring adaptor in the processing chamber. The lift pins may be wafer lift pins. The lift pins may be processing kit ring lift pins. The end effector and the second process kit ring adaptor may be sized and shaped to not interfere with the lift pins. For example, the flat perimeter sides of the second process kit ring adaptor may allow the lift pins to interface with the lower surface of the second process kit ring.

At block 952, the empty second process kit ring adaptor is transferred from the processing chamber to the process kit enclosure system. transferred from the processing chamber to the process kit enclosure system. Block 952 may be similar to the reverse of blocks 932-948. For example, the second process kit ring adaptor may be transferred (e.g., by an end effector of the transfer robot) and aligned via LCF edge capture. The transfer robot may transfer the empty second process kit ring adaptor to a load lock station. The end effector of the factory interface robot may lift the empty second process kit ring adaptor from the load lock station. The load lock station and end effector of the factory interface robot may interface with the empty second process kit ring adaptor in the same or a similar manner as when a second process kit ring is disposed on the second process kit ring adaptor. The second process kit ring adaptor may be transported to the aligner device, placed on the vacuum chuck, rotated to align the second process kit ring adaptor, removed from the vacuum chuck, and transferred to the process kit enclosure system.

In some embodiments, at block 952, the empty second process kit ring adaptor is placed in the process kit enclosure system by the end effector of the factory interface robot. The end effector may enter the process kit enclosure system above a set of fins (e.g., the end effector being aligned with a gap between the fins and the end effector may lower to place the empty second process kit ring adaptor on the fins.

In some embodiments, one or more end effectors may remove a used third process kit ring lifted on lift pins in a processing chamber by inserting the second process kit ring adaptor disposed on an end effector under the used third process kit ring while the lift pins lower (to dispose the used third process kit ring on the second process kit ring adaptor), extract the third process kit ring disposed on the second process kit ring adaptor on the end effector from the processing chamber, aligning one or more of the third process kit ring or the second process kit ring adaptor via LCF edge capture and/or the aligner device, inserting the third process kit ring disposed on the second process kit ring adaptor into the process kit enclosure system, lowering the end effector, and extracting the end effector from the process kit enclosure system.

One or more end effectors may transport a process kit ring adaptor and process kit ring to a processing chamber. An end effector may be inserted under a process kit ring disposed on the process kit ring adaptor in the process kit enclosure system, lifted to lift the process kit ring disposed on the process kit ring adaptor, and extracted from the process kit enclosure system. An end effector may insert the process kit ring disposed on the process kit ring adaptor into a processing chamber (e.g., where a used process kit ring was removed), lift pins may raise to lift the process kit ring off of the process kit ring adaptor, the end effector may extract the process kit ring adaptor from the processing chamber, and the lift pins may lower to place the process kit ring into position in the processing chamber.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A process kit ring adaptor comprising:
   one or more upper surfaces configured to support a process kit ring; and
   one or more lower surfaces configured to interface with an end effector, wherein the process kit ring adaptor supporting the process kit ring is configured to be transported on the end effector within a processing system to provide the process kit ring into a first processing chamber, wherein the process kit ring adaptor is to be removed from the first processing chamber while the process kit ring remains in the first processing chamber, and wherein the process kit ring adaptor is to be transported from the first processing chamber to a second processing chamber to retrieve a used process kit ring from the second processing chamber subsequent to providing the process kit ring into the first processing chamber.

2. The process kit ring adaptor of claim 1, wherein the one or more upper surfaces comprise a first upper surface of a first distal portion of the process kit ring adaptor and a second upper surface of a second distal portion of the process kit ring adaptor.

3. The process kit ring adaptor of claim 2, wherein the first distal portion is opposite the second distal portion.

4. The process kit ring adaptor of claim 2, wherein the first upper surface forms a first recess and the second upper surface forms a second recess, wherein the first recess and the second recess are configured to support the process kit ring.

5. The process kit ring adaptor of claim 1, wherein the one or more lower surfaces comprise a solid planar central region configured to interface with a vacuum chuck.

6. The process kit ring adaptor of claim 1 further comprising a carrier body and contacts secured to the carrier body, wherein the contacts comprise the one or more upper surfaces.

7. The process kit ring adaptor of claim 6, wherein the contacts prevent movement of the process kit ring.

8. The process kit ring adaptor of claim 6, wherein each of the contacts comprises a sloped sidewall configured to allow the process kit ring to slide to a target position at the one or more upper surfaces of the process kit ring adaptor.

9. The process kit ring adaptor of claim 1, wherein the process kit ring adaptor is configured to support a plurality of process kit rings.

10. The process kit ring adaptor of claim 1 further comprising a carrier body and pads secured to the carrier body, wherein the pads comprise the one or more lower surfaces configured to interface with the end effector to avoid movement of the process kit ring adaptor relative to the end effector.

11. The process kit ring adaptor of claim 1, wherein:
the process kit ring adaptor comprises one or more lift pin interfaces that align with carrier lift pins that are configured to lift wafers; and
the process kit ring adaptor is configured to avoid interference with process kit ring lift pins that are to lift the process kit ring off of the process kit ring adaptor.

12. The process kit ring adaptor of claim 1, wherein the process kit ring adaptor is configured to provide a gap between a) an inner sidewall of the process kit ring that comprises a flat surface and b) the process kit ring adaptor, wherein the flat surface of the process kit ring is to be detected via the gap without being interrupted by the process kit ring adaptor.

13. A method comprising:
lifting, using an end effector on a robot arm of a processing system, a process kit ring adaptor and process kit ring disposed on one or more upper surfaces of the process kit ring adaptor, wherein an upper surface of the end effector interfaces with one or more lower surfaces of the process kit ring adaptor; and
transporting, using the end effector, the process kit ring adaptor and the process kit ring disposed on the process kit ring adaptor within the processing system to provide the process kit ring into a first processing chamber, wherein the process kit ring adaptor is to be removed from the first processing chamber while the process kit ring remains in the first processing chamber, and wherein the process kit ring adaptor is to be transported from the first processing chamber to a second processing chamber to retrieve a used process kit ring from the second processing chamber subsequent to providing the process kit ring into the first processing chamber.

14. The method of claim 13 further comprising:
removing, using the end effector, the process kit ring adaptor supporting the process kit ring from a process kit enclosure system coupled to a factory interface; and
transporting, using the end effector, the process kit ring adaptor supporting the process kit ring into a load lock coupled to the factory interface, wherein the robot arm is disposed on the factory interface.

15. The method of claim 13 further comprising:
removing, using the end effector, the process kit ring adaptor supporting the process kit ring from a load lock coupled to a factory interface and a transfer chamber; and
transporting, using the end effector, the process kit ring adaptor supporting the process kit ring into a processing chamber coupled to the transfer chamber, wherein the robot arm is disposed on the transfer chamber.

16. The method of claim 15 further comprising:
lifting, using lift pins of the processing chamber, the process kit ring off of the process kit ring adaptor;
removing, using the end effector, the process kit ring adaptor from the processing chamber; and
lowering, using the lift pins, the process kit ring in the processing chamber.

17. The method of claim 13 further comprising:
transporting, using the end effector, the process kit ring adaptor into a processing chamber under the process kit ring elevated via lift pins of the processing chamber; and
removing, using the end effector, the process kit ring adaptor supporting the process kit ring from the processing chamber.

18. The method of claim 13 further comprising:
scanning the process kit ring to locate a flat surface disposed on an inner sidewall of the process kit ring to align the process kit ring, wherein the process kit ring adaptor is shaped to provide a gap between the flat surface of the process kit ring and the process kit ring adaptor, wherein the flat surface of the process kit ring is to be detected via the gap without being interrupted by the process kit ring adaptor.

19. The method of claim 13 further comprising retaining the process kit ring on the process kit ring adaptor in a process kit enclosure system via a retaining feature inserted between the process kit ring and the process kit ring adaptor.

20. The method of claim 13, wherein the one or more upper surfaces comprise a first upper surface of a first distal portion of the process kit ring adaptor and a second upper surface of a second distal portion of the process kit ring adaptor, wherein the first upper surface forms a first recess and the second upper surface forms a second recess, and wherein the first recess and the second recess are configured to support the process kit ring.

* * * * *